US009847311B2

(12) United States Patent
Kadoguchi

(10) Patent No.: US 9,847,311 B2
(45) Date of Patent: Dec. 19, 2017

(54) SEMICONDUCTOR DEVICE AND MANUFACTURING METHOD FOR THE SEMICONDUCTOR DEVICE

(71) Applicant: TOYOTA JIDOSHA KABUSHIKI KAISHA, Toyota-shi, Aichi-ken (JP)

(72) Inventor: Takuya Kadoguchi, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/930,816

(22) Filed: Nov. 3, 2015

(65) Prior Publication Data
US 2016/0126205 A1  May 5, 2016

(30) Foreign Application Priority Data

Nov. 4, 2014  (JP) ................. 2014-224009

(51) Int. Cl.
*H01L 23/48* (2006.01)
*H01L 23/00* (2006.01)
(Continued)

(52) U.S. Cl.
CPC .......... *H01L 24/27* (2013.01); *H01L 23/3107* (2013.01); *H01L 23/49537* (2013.01);
(Continued)

(58) Field of Classification Search
CPC ......... H01L 23/49562; H01L 23/49537; H01L 23/49575; H01L 23/49582; H01L 23/3107;
(Continued)

(56) References Cited

U.S. PATENT DOCUMENTS

2004/0195649 A1* 10/2004 Miura ................. H01L 23/4334
257/529
2006/0273592 A1* 12/2006 Yamabuchi ........... H02M 7/003
290/40 C (Continued)

FOREIGN PATENT DOCUMENTS

EP    2 824 696 A1    1/2015
JP    09-172124 A    6/1997
(Continued)

*Primary Examiner* — Vongsavanh Sengdara
(74) *Attorney, Agent, or Firm* — Finnegan, Henderson, Farabow, Garrett & Dunner, LLP

(57) ABSTRACT

A semiconductor device includes first and second semiconductor elements and first and second conductive members. A first electrode on the first semiconductor element is bonded to a first stack part of the first conductive member by a first bonding layer. A second electrode on the second semiconductor element is bonded to a second stack part of the second conductive member by a second bonding layer. A first joint part of the first conductive member is bonded to a second joint part of the second conductive member by an intermediate bonding layer. A first surface of the first joint part facing the second joint part, a side surface of the first joint part continuous from the first surface, a second surface of the second joint part facing the first joint part, and a side surface of the second joint part continuous from the second surface are covered by nickel layers.

8 Claims, 14 Drawing Sheets

(51) Int. Cl.
*H01L 23/495* (2006.01)
*H01L 23/31* (2006.01)
*H01L 23/051* (2006.01)

(52) U.S. Cl.
CPC .. *H01L 23/49562* (2013.01); *H01L 23/49575* (2013.01); *H01L 23/49582* (2013.01); *H01L 24/33* (2013.01); *H01L 24/83* (2013.01); *H01L 23/051* (2013.01); *H01L 2224/2711* (2013.01); *H01L 2224/2712* (2013.01); *H01L 2224/27848* (2013.01); *H01L 2224/3303* (2013.01); *H01L 2224/33505* (2013.01); *H01L 2224/33517* (2013.01)

(58) Field of Classification Search
CPC ....... H01L 23/051; H01L 24/27; H01L 24/33; H01L 24/83; H01L 2224/33505; H01L 2224/3303; H01L 2224/2711; H01L 2224/2712; H01L 2224/33517; H01L 2224/27848
USPC ........................................... 257/736; 438/107
See application file for complete search history.

(56) References Cited

U.S. PATENT DOCUMENTS

| | | | | |
|---|---|---|---|---|
| 2008/0054425 | A1* | 3/2008 | Malhan | H01L 24/72 257/678 |
| 2012/0001308 | A1* | 1/2012 | Fukutani | H01L 23/49524 257/675 |
| 2014/0035112 | A1 | 2/2014 | Kadoguchi et al. | |
| 2014/0264819 | A1 | 9/2014 | Okumura et al. | |
| 2015/0028466 | A1* | 1/2015 | Kadoguchi | H01L 23/498 257/676 |

FOREIGN PATENT DOCUMENTS

| | | |
|---|---|---|
| JP | 2001-326312 A | 11/2001 |
| JP | 4403665 | 1/2010 |
| JP | 2012-235081 | 11/2012 |
| JP | 2013-16623 | 1/2013 |
| JP | 2013-118416 A | 6/2013 |
| JP | 2013-175578 | 9/2013 |
| JP | 2014-179443 A | 9/2014 |
| WO | WO 2013/133134 A1 | 9/2013 |

* cited by examiner

| SUBSTANCE | YOUNG'S MODULUS(GPa) | CURRENT DENSITY j(A/m2) |
|---|---|---|
| Sn-BASED SOLDER | 42 | |
| Cu6Sn5 | 86 | GREATER THAN Sn-BASED SOLDER |
| Cu3Sn | 108 | GREATER THAN Sn-BASED SOLDER |
| Ni3Sn4 | 133 | GREATER THAN Sn-BASED SOLDER |
| Ag | 80 | GREATER THAN Sn-BASED SOLDER |

SEMICONDUCTOR DEVICE AND MANUFACTURING METHOD FOR THE SEMICONDUCTOR DEVICE

INCORPORATION BY REFERENCE

The disclosure of Japanese Patent Application No. 2014-224009 filed on Nov. 4, 2014 including the specification, drawings and abstract is incorporated herein by reference in its entirety.

BACKGROUND OF THE INVENTION

1. Field of the Invention

The present specification discloses a semiconductor device and a manufacturing method for the semiconductor device.

2. Description of Related Art

For example, Japanese Patent Application Publication No. 2012-235081 (JP 2012-235081 A) and Japanese Patent Application Publication No. 2013-016623 (JP 2013-016623 A) disclose a semiconductor device, in which a first conductive member electrically connected to a first electrode of a first semiconductor element, and a second conductive member electrically connected to a second electrode of a second semiconductor element, are bonded to each other through a bonding layer. A tin-based solder material or the like is used for bonding.

The first conductive member includes a first stack part that is stacked to the first semiconductor element on the first electrode side, and a first joint part extending from the first stack part. The second conductive member includes a second stack part that is stacked to the second semiconductor element on the second electrode side, and a second joint part extending from the second stack part. The first electrode and the first stack part are bonded to each other by a first bonding layer, and the second electrode and the second stack part are bonded to each other by a second bonding layer. The first joint part and the second joint part are bonded to each other by an intermediate bonding layer.

When current flows through bonded surfaces made from different metals, a phenomenon occurs in which metal atoms move from one of the metals to the other metal and voids are generated in one of the metals. For example, when current flows through a boundary surface between copper and a bonding layer, there are instances where metal moves from the bonding layer to the copper, and voids are made in the bonding layer. This phenomenon is called an electromigration phenomenon. Herein below, for convenience of explanation, the electromigration phenomenon is referred to as an EM phenomenon for short. Japanese Patent Application Publication No. 2013-175578 (JP 2013-175578 A) discloses a technology for restraining the EM phenomenon in a flip chip such as CPU. In JP 2013-175578 A, a nickel layer is formed on an electrode pad, and a solder material (solder bump) is mounted on the nickel layer to bond the flip chip electrode to the electrode pad. The nickel layer restrains metal atoms from moving between a solder layer, which is the melted and solidified solder material, and a base material of the electrode pad.

With demands for compact semiconductor devices, a first joint part and a second joint part are also downsized. In FIG. 22 and FIG. 23 of JP 2013-016623 A, a semiconductor device is disclosed, in which a joint part (referred to as a "conductive part 90" in JP 2013-016623 A) is smaller than a stack part (referred to as a "heat sink" in JP 2013-016623 A). When, an area of the intermediate bonding layer, by which the first joint part and the second joint part are bonded to each other, is smaller than an area of the first bonding layer, by which the first electrode and the first stack part are bonded to each other, it is more likely that the EM phenomenon occurs in the intermediate bonding layer. Similarly, when the area of the intermediate bonding layer, by which the first joint part and the second joint part are bonded to each other, is smaller than an area of the second bonding layer, by which the second electrode and the second stack part are bonded to each other, it is more likely that the EM phenomenon occurs in the intermediate bonding layer.

SUMMARY OF THE INVENTION

It is considered that progression of the EM phenomenon can be restrained by forming the nickel layer on respective surfaces of the first joint part and the second joint part, which face each other. However, as the first joint part and the second joint part are downsized, and an overlapping area of the first joint part and the second joint part becomes small, there are instances where the EM phenomenon progresses in the intermediate bonding layer even if the nickel layer is formed in the respective surfaces of the first joint par and the second joint part, which face each other. The invention provides a semiconductor device and a manufacturing method for the semiconductor device, by which progression of the EM phenomenon is restrained in the intermediate bonding layer that bonds the first joint part and the second joint part to each other.

A first aspect of the invention is a semiconductor device. In the semiconductor device, a first semiconductor element and a second semiconductor element are electrically connected to each other by a first conductive member and a second conductive member. A first electrode is arranged on a surface of the first semiconductor element. A second electrode is arranged on a surface of the second semiconductor element. The first conductive member has a first stack part stacked to the first semiconductor element to face the first electrode, and a first joint part extending from the first stack part. The second conductive member has a second stack part stacked to the second semiconductor element to face the second electrode, and a second joint part, the second joint part extending from the second stack part and facing the first joint part. The first electrode and the first stack part are bonded to each other by a first bonding layer. The second electrode and the second stack part are bonded to each other by a second bonding layer. The first joint part and the second joint part are bonded to each other by an intermediate bonding layer. An area of the intermediate bonding layer is smaller than both an area of the first bonding layer and an area of the second bonding layer when seen in a direction perpendicular to a bonded surface of the intermediate bonding layer. A first surface of the first joint part facing the second joint part, a side surface of the first joint part continuous from the first surface, a second surface of the second joint part facing the first joint part, and a side surface of the second joint part continuous from the second surface are covered by nickel layers.

The first conductive member and the second conductive member may be entirely covered by the nickel layers. Alternatively, only the first surface and its side surface, and the second surface and its side surface of the joint parts may be covered by the nickel layers. In short, it is only necessary that at least the first surface and its side surface, and the second surface and its side surface of the joint parts are covered by the nickel layer.

In general, in the semiconductor device having the foregoing structure that includes the joint parts, the first conductive member and the second conductive member are formed by pressing. In the case of manufacturing the first conductive member and the second conductive member covered by the nickel layer, nickel is plated on a plate-shaped member before pressing, and the plate-shaped member plated with nickel is pressed. Thus, the first conductive member and the second conductive member having the stack parts and the joint parts are manufactured. According to a method of the related art, the surfaces of the joint parts, which face each other, are covered by a nickel layer. However, the side surfaces, which are continuous from the surfaces facing each other, are not covered by the nickel layer.

It was found that, as the joint parts become small and the bonding surfaces for the intermediate bonding layer thus become small, the EM phenomenon occurs through the side surfaces of the joint parts. For example, a bonding material leaking out from between the surfaces of the joint parts, which face each other, is adhered to the side surfaces of the joint parts, and that is where the EM phenomenon can occur. In the first aspect of the invention, progression of EM phenomenon in the joint parts is effectively restrained by providing the nickel layer on the side surfaces of the joint parts, where the nickel layer has not been necessary.

In the first aspect of the invention, a thickness of the intermediate bonding layer may be smaller than both a thickness of the first bonding layer and a thickness of the second bonding layer.

In the above configuration, Young's modulus of the intermediate bonding layer may be greater than both Young's modulus of the first bonding layer and Young's modulus of the second bonding layer.

Although the details are given later, the larger Young's modulus of the bonding layer becomes, the less likely that the EM phenomenon occurs. The intermediate bonding layer has a high current density due to its small area. When such an intermediate bonding layer is made of a substance having larger Young's modulus than those of the first bonding layer and the second bonding layer, which have larger areas than the intermediate bonding layer, it is possible to restrain progression of the EM phenomenon in the intermediate bonding layer. After covering the surfaces of the joint parts, which face each other, and the side surfaces continuous from those surfaces with the nickel layer, the intermediate bonding layer is made of a substance with large Young's modulus. Then, a large effect of restraining the EM phenomenon is expected. An inhibitory effect of the EM phenomenon is also expected only by structuring the intermediate bonding layer from a substance with larger Young's modulus, without providing the nickel layer.

As stated later, the first bonding layer includes a plurality of layers, each of which could be formed from substances with different Young's moduli. Typically, the first bonding layer can include a layer maintaining a composition of a solder material before melting, and a layer in which the solder material is changed into an intermetallic compound. Young's modulus of a main component of the solder material and Young's modulus of the intermetallic compound are different. The likelihood of occurrence of the EM phenomenon depends on the layer made from a substance with the smallest Young's modulus. When the first bonding layer includes a plurality of layers, the smallest Young's modulus amongst the Young's moduli of substances structuring the respective layers is referred to as Young's modulus of the first bonding layer. This also applies to the second bonding layer and the intermediate bonding layer.

In the above configuration, each of the first bonding layer and the second bonding layer may include a layer maintaining a composition of a tin solder material. Furthermore, the intermediate bonding layer may be made of an intermetallic compound of tin.

In the above configuration, each of the first bonding layer and the second bonding layer may include a layer maintaining a composition of a tin solder material. Furthermore, the intermediate bonding layer may be made of at least one of silver and a compound of silver.

A second aspect of the invention is a manufacturing method for the semiconductor device according to the first aspect of the invention. The manufacturing method includes: forming the first conductive member and the second conductive member by pressing a plate-shaped member; and forming a nickel layer on the first surface, the side surface continuous from the first surface, the second surface, and the side surface continuous from the second surface after the pressing.

A third aspect of the invention is a semiconductor device. In the semiconductor device, a first semiconductor element and a second semiconductor element are electrically connected to each other by a first conductive member and a second conductive member. A first electrode is formed on a surface of the first semiconductor element. A second electrode is formed on a surface of the second semiconductor element. The first conductive member has a first stack part stacked to the first semiconductor element to face the first electrode, and a first joint part extending from the first stack part. The second conductive member has a second stack part stacked to the second semiconductor element to face the second electrode, and a second joint part, the second joint part extending from the second stack part and facing the first joint part. The first electrode and the first stack part are bonded to each other by a first bonding layer. The second electrode and the second stack part are bonded to each other by a second bonding layer. The first joint part and the second joint part are bonded to each other by an intermediate bonding layer. An area of the intermediate bonding layer is smaller than both an area of the first bonding layer and an area of the second bonding layer when seen in a direction perpendicular to a bonded surface of the intermediate bonding layer. Young's modulus of the intermediate bonding layer is greater than both Young's modulus of the first bonding layer, and Young's modulus of the second bonding layer.

A fourth aspect of the invention is a manufacturing method for the semiconductor device according to the third aspect of the invention. The manufacturing method includes: arranging the first semiconductor element, the second semiconductor element, the first conductive member, and the second conductive member so as to have a positional relationship where the first semiconductor element and the first stack part are stacked to each other through a first tin solder material, the second semiconductor element and the second stack part are stacked to each other through a second tin solder material, and the first joint part and the second joint part face each other through a third tin solder material; and melting the first tin solder material, the second tin solder material, and the third tin solder material by heating the first tin solder material, the second tin solder material, and the third tin solder material in the positional relationship. An amount of the third tin solder material is smaller than both an amount of the first tin solder material and an amount of the second tin solder material. The heating is stopped in a state where a layer maintaining a composition of the third tin solder material disappears between the first joint part and the second joint part, a layer maintaining a composition of the first tin solder material remains between the first semiconductor element and the first stack part, and a layer maintaining a composition of the second tin solder material remains between the second semiconductor element and the second stack part.

Young's modulus is small in the layer maintaining the composition of the first tin solder material, and it is possible to obtain a relationship where Young's modulus of the intermediate bonding layer is greater than any of Young's modulus of the first bonding layer and Young's modulus of the second bonding layer. Each tin solder material changes into the intermetallic compound of tin due to heating. Examples of the intermetallic compound of tin are Cu6Sn5, Cu3Sn, and Ni3Sn4 (in the case where the nickel layer is formed on the surface of the joint member). In any case, the intermetallic compound has Young's modulus greater than that of tin.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8B is an enlarged sectional view of a bonding layer 8a;

DETAILED DESCRIPTION OF EMBODIMENTS

Figure 1:
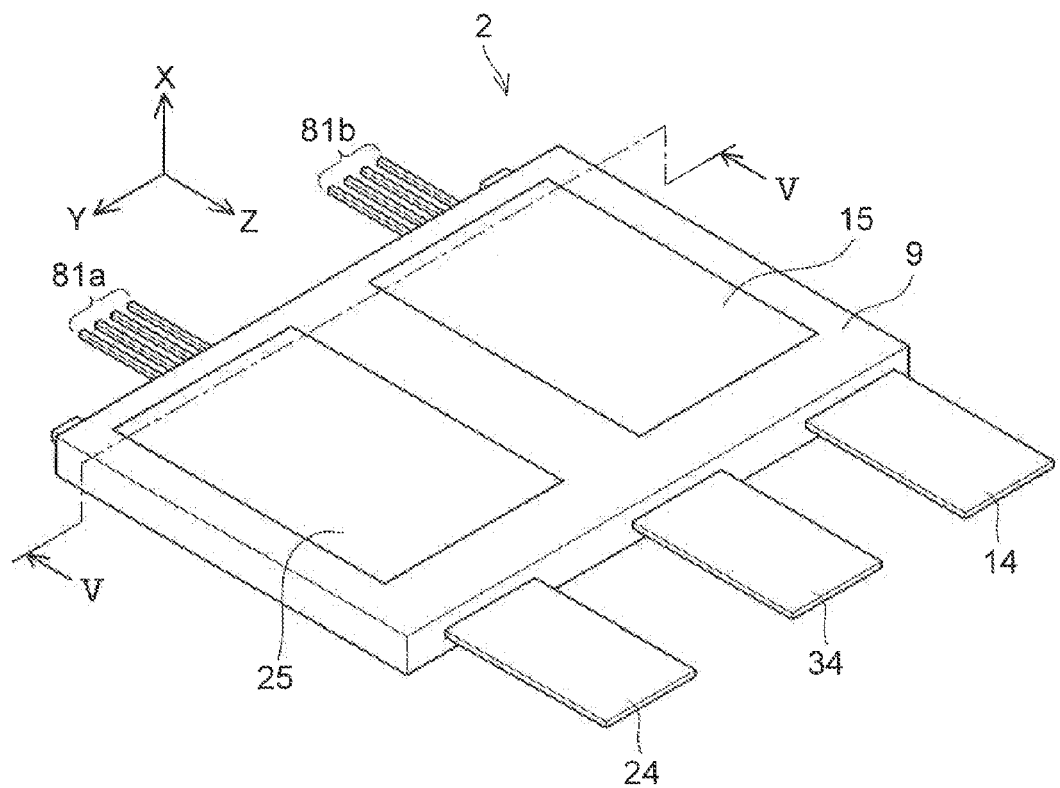
FIG. 1 is a perspective view of a semiconductor device according to the first embodiment of the invention.
Figure 2:
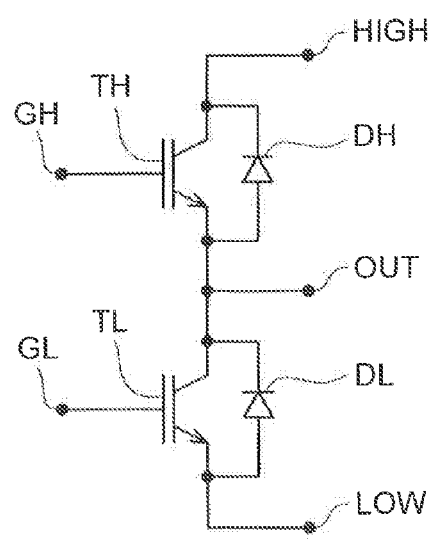
FIG. 2 is an electric circuit diagram of the semiconductor device.

Herein below, the first embodiment of the invention is explained. A semiconductor device 2 of the first embodiment is explained with reference to the drawings. FIG. 1 shows a perspective view of the semiconductor device 2. The semiconductor device 2 is a device in which four power semiconductor elements are molded in a resin-made package 9. FIG. 2 shows a circuit diagram inside the semiconductor device 2. The semiconductor device 2 has a circuit that is structured from two transistors TH, TL and two diodes DH, DL. The two transistors TH, TL and the two diodes DH, DL all belong to power semiconductor elements. Specifically, each of the transistors TH, TL and the diodes DH, DL has allowable current of 100 ampere or higher, and is an element mainly used for power conversion. The semiconductor device 2 is typically used for an inverter that supplies electric power to a traction motor in an electric automobile, a hybrid vehicle, a fuel-cell vehicle, and so on.

The two transistors TH, TL are connected to each other in series. The diode DH is connected in anti-parallel with the transistor TH, and the diode DL is connected in anti-parallel with the transistor TL. For convenience of explanation, one of terminals on both ends of the series connection is referred to as a HIGH terminal, and the other one is referred to as a LOW terminal. A midpoint of the series connection is referred to as an OUT terminal. A P terminal 24 in FIG. 1 corresponds to the HIGH terminal, an N terminal 34 in FIG. 1 corresponds to the LOW terminal, and an O terminal 14 in FIG. 1 corresponds to the OUT terminal. A gate terminal GH of the transistor TH corresponds to one of control terminals 81a shown in FIG. 1. A gate terminal GL of the transistor TL corresponds to one of control terminals 81b shown in FIG. 1. The rest of the control terminals 81a, 81b are signal elements for monitoring states of the semiconductor elements.

As shown in FIG. 1, heat sinks 15, 25 are exposed on one of side surfaces of the package 9. One surface of the heat sink 15 is exposed on one side surface of the package 9, and the other surface of the heat sink 15 is conductive with later-described first transistor element 3 and first diode element 4 inside the package 9. One of the surfaces of the heat sink 25 is exposed on one side surface of the package 9, and the other surface of the heat sink 25 is conductive with later-described second transistor element 5 and second diode element 6 inside the package 9. Although hidden and invisible in FIG. 1, two heat sinks 12, 22 are also exposed on the other side surface of the package 9. The structure inside the package 9, including the heat sinks 12, 22, is explained next.

Figure 3:
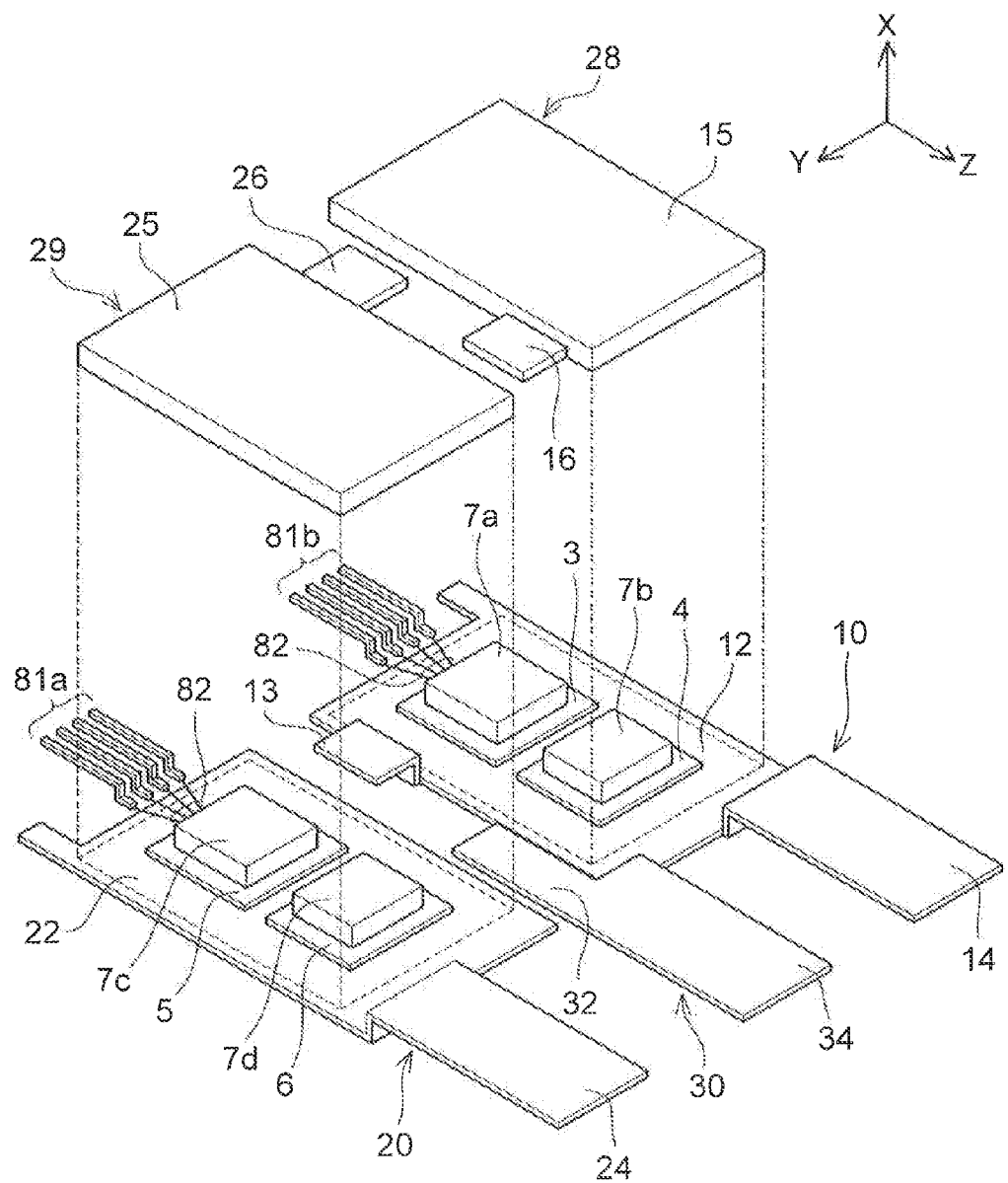
FIG. 3 is a partial exploded view of the semiconductor device (except a package)
Figure 4:
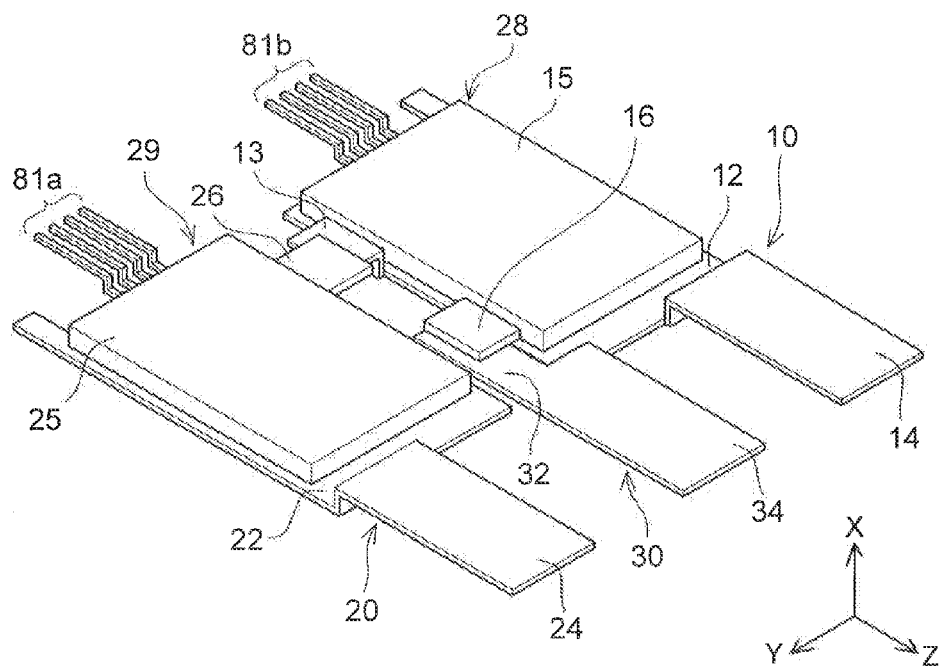
FIG. 4 is a perspective view of the semiconductor device (except the package)

FIG. 3 is a view of components of the semiconductor device 2 except the package 9, and is a view depicting exploded heat sinks 15, 25. FIG. 4 is a perspective view of the semiconductor device 2 except the package 9. For convenience of explanation, an X-axis positive direction of the coordinate system in the drawing is referred to as "up", and an X-axis negative direction is referred to as "down". In the following drawings, expressions of "up" and "down" are sometimes used.

The two heat sinks 12, 22 are located at the lowermost position. The O terminal 14 extends from one edge of the heat sink 12, and a first joint part 13 extends from another edge. The heat sink 12, the O terminal 14, and the first joint part 13 are continuous. The heat sink 12, the O terminal 14, and the first joint part 13 are collectively referred to as an intermediate terminal 10. The P terminal 24 extends from one edge of the heat sink 22. The heat sink 22 and the P terminal 24 are continuous. The heat sink 22 and the P terminal 24 are collectively referred to as a positive electrode terminal 20. The N terminal 34 is arranged between the O terminal 14 and the P terminal 24. A joint part 32 extends from an edge of the N terminal 34. The N terminal 34 and the joint part 32 are collectively referred to as a negative electrode terminal 30.

The first transistor element 3 is stacked to and bonded to the heat sink 12. Also, the first diode element 4 is stacked to and bonded to the heat sink 12. The first transistor element 3 has a flat-plate shape, and electrodes are arranged on both surfaces of the first transistor element 3, respectively. A collector electrode is arranged on a lower surface of the first transistor element 3, and an emitter electrode is arranged on an upper surface of the first transistor element 3. A gate electrode and the other signal elements are arranged on the upper surface of the first transistor element 3. A cathode electrode is arranged on a lower surface of the first diode element 4, and an anode electrode is arranged on an upper surface of the first diode element 4. The heat sink 12 connects the collector electrode of the first transistor element 3 to the cathode terminal of the first diode element 4. A spacer 7a is bonded to the emitter electrode on the upper surface of the first transistor element 3. A spacer 7b is bonded to the anode electrode on the upper surface of the first diode element 4. The heat sink 15 is bonded on the spacer 7a and the spacer 7b. The heat sink 15 connects the emitter electrode of the first transistor element 3 to the anode electrode of the first diode element 4. One end of each of the bonding wires 82 is bonded to the gate electrode and the other signal elements on the upper surface of the first transistor element 3. The other ends of the bonding wires 82 are bonded to the control terminals 81b.

The second transistor element 5 is stacked to and bonded to the heat sink 22. Also, a second diode element 6 is stacked to and bonded to heat sink 22. The second transistor element 5 also has a flat-plate shape, and electrodes are arranged on both surfaces of the second transistor element 5, respectively. A collector electrode is arranged on a lower surface of the second transistor element 5, and an emitter electrode is arranged on the upper surface of the second transistor element 5. A gate electrode and the other signal elements are arranged on the upper surface of the second transistor element 5. A cathode electrode is arranged on a lower surface of the second diode element 6, and an anode electrode is arranged on an upper surface of the second diode element 6. The heat sink 22 connects the collector electrode of the second transistor element 5 to the cathode electrode of the second diode element 6. A spacer 7c is bonded to the emitter electrode on the upper surface of the second transistor element 5. A spacer 7d is bonded to an anode electrode on the upper surface of the second diode element 6. The heat sink 25 is bonded onto the spacer 7c and the spacer 7d. The heat sink 25 connects the emitter electrode of the second transistor element 5 to the anode electrode of the second diode element 6. One end of each of the bonding wires 82 is bonded to the gate electrode and the other signal elements on the upper surface of the second transistor element 5. The other ends of the bonding wires 82 are bonded to the control terminals 81a.

A joint part 16 extends from an edge of the heat sink 15. The heat sink 15 and the joint part 16 are collectively referred to as a first relay plate 28. A second joint part 26 extends from an edge of the heat sink 25. The heat sink 25 and the second joint part 26 are referred to as a second relay plate 29. The joint part 16 of the first relay plate 28 faces and is bonded to the joint part 32 of the negative electrode terminal 30. The second joint part 26 of the second relay plate 29 faces and is bonded to the first joint part 13 of the intermediate terminal 10. As a result of the above-mentioned connections, the circuit shown in FIG. 2 completes. The first transistor element 3 corresponds to the transistor TL in FIG. 2, and the second transistor element 5 corresponds to the transistor TH in FIG. 2. The first diode element 4 corresponds to the diode DL in FIG. 2, and the second diode element 6 corresponds to the diode DH in FIG. 2.

The intermediate terminal 10, the positive electrode terminal 20, the negative electrode terminal 30, the first relay plate 28, the second relay plate 29, and the control terminals 81a, 81b are partially conductive with the semiconductor elements such as the first transistor element 3 inside the package 9, and are partially exposed outside the package 9. These conductive members are collectively called lead frames.

Figure 5:
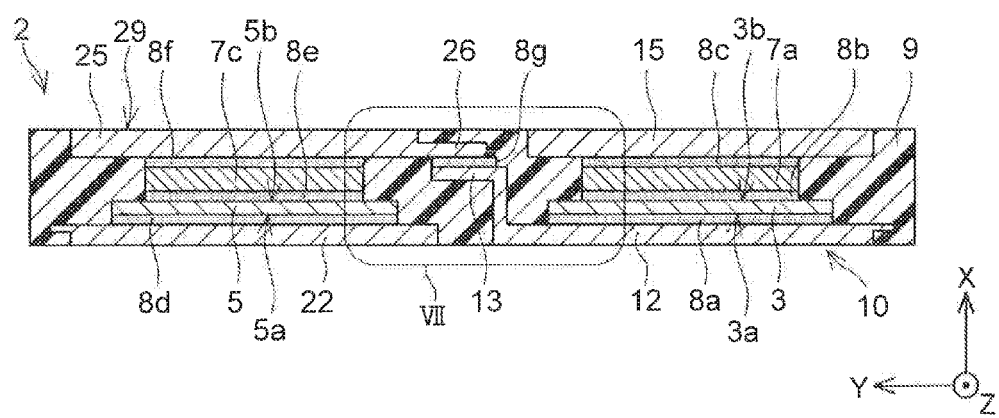
FIG. 5 is a sectional view taken along the line V-V in FIG. 1.

FIG. 5 shows a bonding relationship among the first transistor element 3, the second transistor element 5, and the lead frames. FIG. 5 is a sectional view taken along the line V-V in FIG. 1. As stated earlier, the collector electrode 3a is arranged on the lower surface of the first transistor element 3, and the emitter electrode 3b is arranged on the upper surface of the first transistor element 3. The heat sink 12 and the collector electrode 3a of the first transistor element 3 are bonded to each other by a bonding layer 8a. The emitter electrode 3b of the first transistor element 3 and the spacer 7a are bonded to each other by a bonding layer 8b. The spacer 7a and the heat sink 15 are bonded to each other by a bonding layer 8c.

A connection relationship between the first transistor element 3 and the second transistor element 5 is as follows. The first transistor element 3 and the second transistor element 5 are electrically connected to each other through the intermediate terminal 10 and the second relay plate 29. The collector electrode 3a is arranged on the lower surface of the first transistor element 3, and the emitter electrode 5b is arranged on the upper surface of the second transistor element 5. The collector electrode 5a is arranged on the lower surface of the second transistor element 5. The intermediate terminal 10 includes the heat sink 12, which is stacked to the first transistor element 3 on the collector electrode 3a side, and the first joint part 13 extending from the edge of the heat sink 12. The second relay plate 29 includes the heat sink 25, which is stacked to the second transistor element 5 on the emitter electrode 5b side, and the second joint part 26 extending from the edge of the heat sink 25. The spacer 7c is present between the second transistor element 5 and the heat sink 25. The collector electrode 3a and the heat sink 12 are bonded to each other by the bonding layer 8a, and the emitter electrode 5b and the heat sink 25 are bonded to each other by the bonding layers 8e, 8f. The second joint part 26 and the first joint part 13 face each other and are bonded to each other by a bonding layer 8g.

Although not shown in FIG. 5, a nickel layer is formed on each of the surfaces of the first joint part 13 and the second joint part 26. The nickel layer is explained later.

Figure 6:
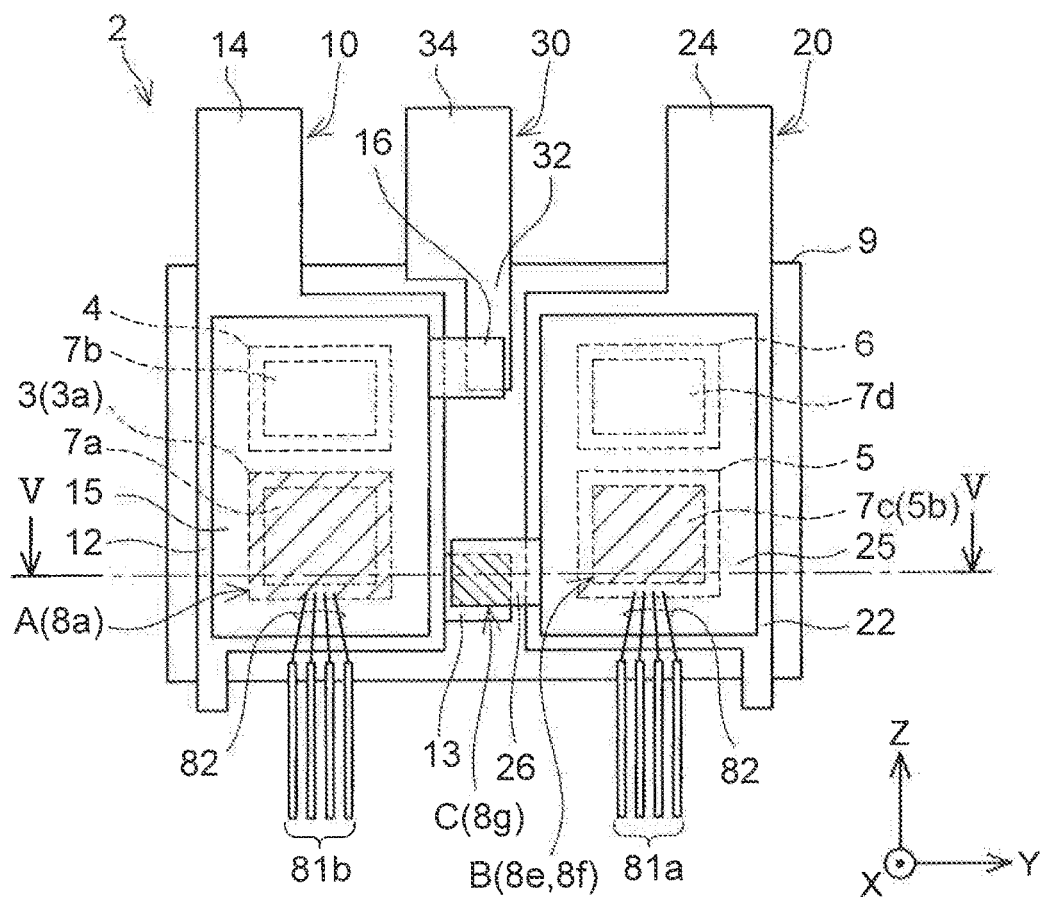
FIG. 6 is a plan view of the semiconductor device (except the package)

Here, areas of the bonding layers, which electrically connect the transistor elements 3, 5 to each other, are explained in a view from a direction orthogonal to the bonded surfaces. The direction orthogonal to the bonded surfaces corresponds to the X-axis direction of the coordinate system in the drawing. FIG. 6 shows a plan view of the semiconductor device 2. FIG. 6 is a view from the positive direction in the X axis, and corresponds to a view from the direction orthogonal to the bonded surfaces. In FIG. 5, the package 9 is depicted only by the outline so that the structure inside the package 9 is understood. A section taken along the line V-V in FIG. 6 corresponds to the sectional view in FIG. 5.

In FIG. 6, a hatching region shown by symbol A indicates a range of the collector electrode 3a of the first transistor element 3. Therefore, the hatching region A corresponds to a region in which the collector electrode 3a of the first transistor element 3 overlaps the heat sink 12. The hatching region A also corresponds to a region of the bonding layer 8a that bonds the collector electrode 3a and the heat sink 12 to each other. A hatching region shown by symbol B indicates a range of the emitter electrode 5b of the second transistor element 5. The hatching region B coincides with the range of the spacer 7c. The hatching region B also corresponds to a region in which the emitter electrode 5b of the second transistor element 5 overlaps the heat sink 25. The hatching region B also corresponds to a region of the bonding layers 8e, 8f that bond the emitter electrode 5b and the heat sink 25 to each other. Furthermore, a hatching region shown by symbol C indicates a region in which the first joint part 13 overlaps the second joint part 26. The hatching region C corresponds to a region of the bonding layer 8g that bonds the first joint part 13 and the second joint part 26 to each other. As shown well in FIG. 6, when seen in a direction perpendicular to the bonded surfaces, an area of the bonding layer 8g (the hatching region C) is smaller than an area of the bonding layer 8a (the hatching region A) that bonds the collector electrode 3a and the heat sink 12 to each other. Also, when seen in the direction perpendicular to the bonded surfaces, an area of the bonding layer 8g (the hatching region C) is smaller than an area of each of the bonded layers 8e and 8f (the hatching region B) which bond the emitter electrode 5b and the heat sink 25 to each other.

Allowable current values of the first transistor element 3 and the second transistor element 5 are 100 ampere or larger. The size of the collector electrode 3a of the first transistor element 3 is designed in consideration of those allowable current values. Even if current at an allowable current value flows, generation of voids in the bonding layer 8a due to the electromigration phenomenon (EM phenomenon) is unlikely. Similarly, generation of voids in the bonding layers 8e, 8f due to the EM phenomenon is unlikely. Meanwhile, the region in which the first joint part 13 and the second joint part 26 overlap each other, or an area of the bonding layer 8g, is smaller than the area of any of the bonding layers 8a, 8e, 8f. A current density in the bonding layer 8g becomes higher than current densities in the bonding layers 8a, 8e, 8f. Therefore, when current flows in the first transistor element 3 or the second transistor element 5, voids could be generated in the bonding layer 8g due to the EM phenomenon. Allowable current values of the first diode element 4 and the second diode element 6 are also 100 ampere or higher. When seen in a direction perpendicular to the bonded surfaces, a relationship among the bonding layer between the first diode element 4 and the heat sink 12, the bonding layer between the second diode element 6 and the heat sink 25, and the bonding layer 8g between the first joint part 13 and the second joint part 26 is the same as above.

The EM phenomenon is a phenomenon in which atoms move between a conductive member and a bonding layer because of current, and voids (gaps) are thus generated. As voids grow, electric resistance increases. In the semiconductor device 2, in order to restrain growth of voids, the nickel layer is provided not only on the bonded surfaces, where a current density becomes large, but also on a side surface that is continuous from the bonded surface. The nickel layer functions as a barrier that prevents movements of atoms of the bonding layer and the conductive member. To be specific, in the semiconductor device 2, the nickel layer is provided on an upper surface 13a of the first joint part 13 bonded by the bonding layer 8g, and a side surface 13b that is continuous from the upper surface 13a. Similarly, the nickel layer is provided on a lower surface 26c of the second joint part 26 bonded by the bonding layer 8g, and a side surface 26b that is continuous from the lower surface 26c. These nickel layers are explained next.

Figure 7:
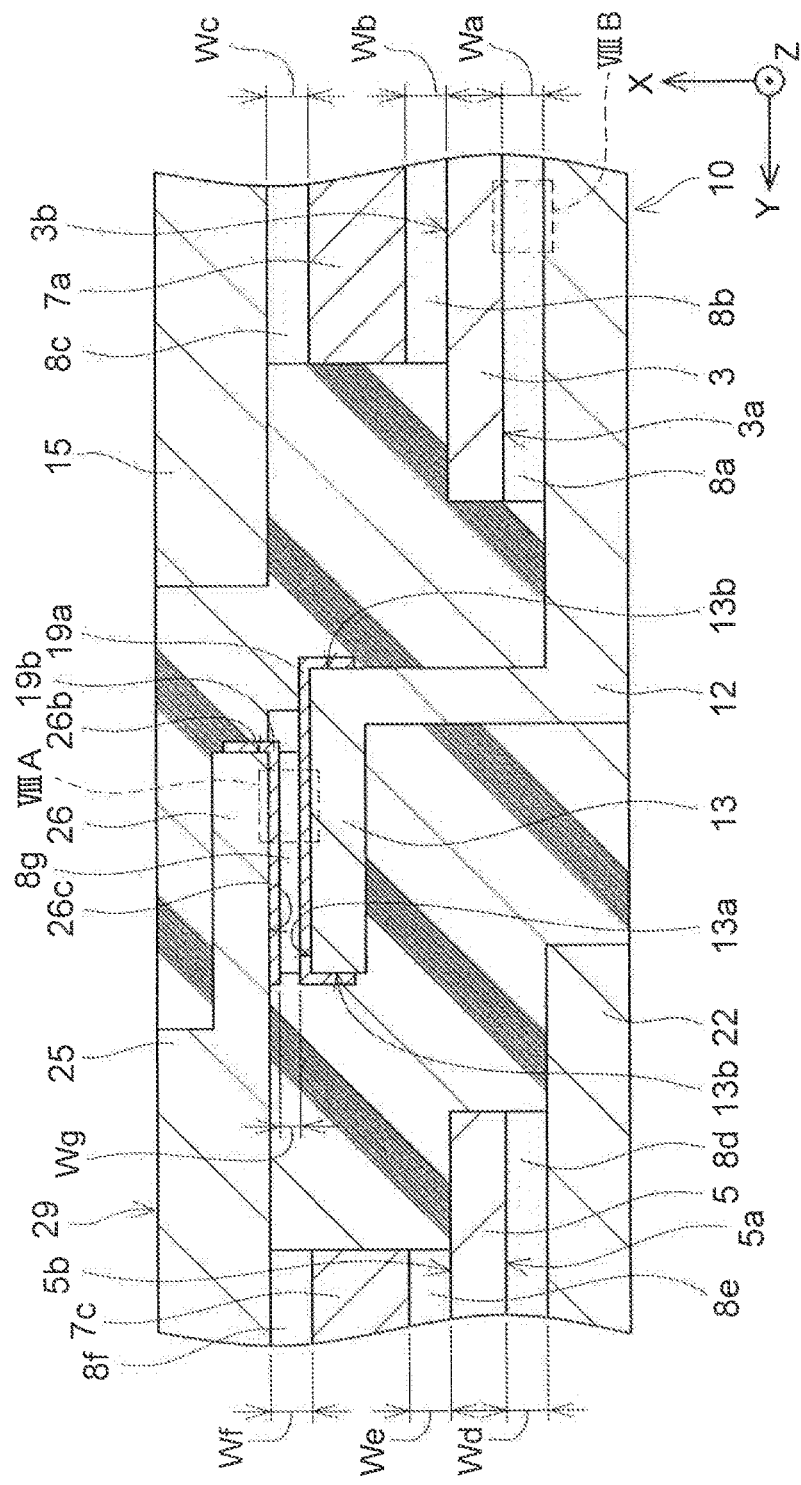
FIG. 7 is an enlarged view of a range shown by sign VII in FIG. 5.

FIG. 7 is an enlarged view of the range shown by symbol VII in FIG. 5. As shown in FIG. 7, the upper surface 13a of the first joint part 13 and the lower surface 26c of the second joint part 26 face each other, and are also bonded to each other by the bonding layer 8g. The upper surface 13a of the first joint part 13 and the side surface 13b continuous from the upper surface 13a are covered by a nickel layer 19a. The lower surface 26c of the second joint part 26, and the side surface 26b continuous from the lower surface 26c are also covered by a nickel layer 19b. Note that a side surface of the first joint part 13, and a side surface of the second joint part 26, which are not shown in FIG. 7, are also covered by the nickel layers.

Effects of the nickel layers 19a, 19b are explained. In the semiconductor device 2, a tin-based solder material, such as a Sn—Cu solder material and a Sn—Cu—Ni solder material, is used as a bonding material. When this solder material is melted by receiving heat and solidified thereafter, an intermetallic compound of tin is generated. Specifically, copper (Cu), which forms the conductive members such as the heat sink 12 and the first joint part 13, and tin (Sn) serving as the solder material react to one another, and an intermetallic compound such as Cu6Sn5 and Cu3Sn is generated. Alternatively, tin (Sn) reacts with nickel (Ni) of the nickel layer or nickel (Ni) contained in the tin-based solder material, and an intermetallic compound such as Ni3Sn4 is generated. In short, although the bonding layers 8a to 8g are formed from a tin-based solder material, an intermetallic compound layer made of Cu6Sn5, Cu3Sn, or Ni3Sn4 is formed on the boundary (a bonding interface) with the conductive member.

Atoms of copper (Cu) that structures the conductive members such as the heat sinks 12, 15, 22, 25 and the first and second joint parts 13, 26, and atoms of tin (Sn) contained in the solder material have different diffusion speeds. Therefore, there are instances where voids are generated in the bonding layer. When a density of current flowing in the bonding layer is high, generation and growth of voids are promoted. As voids grow, conductivity is deteriorated. In other words, as voids grow, electric resistance of the bonding layer increases. As explained with reference to FIG. 6, the area of the bonding layer 8g between the first joint part 13 and the second joint part 26 is smaller than that of any of the bonding layers 8a, 8e, 8f. Hence, a density of current flowing in the bonding layer 8g is higher, causing concern over growth of voids in the bonding layer 8g. However, as shown in FIG. 7, the upper surface 13a of the first joint part 13, which is in contact with the bonding layer 8g, is covered by the nickel layer 19a. The foregoing layer of intermetallic compound Ni3Sn4 is formed on the bonding interface between the nickel layer 19a and the bonding layer 8g. The nickel layer 19a and the layer of intermetallic compound Ni3Sn4 serve as a barrier that prevents movements of atoms. The lower surface 26c of the second joint part 26, which is in contact with the bonding layer 8g, is also covered by the nickel layer 19b. The nickel layers 19a, 19b are nickel-based plating. In FIG. 7, only a part of the first joint part 13 and a part of the second joint part 26 are covered by the nickel layers. However, the entire intermediate terminal 10 including the first joint part 13 may be covered by the nickel layer. The entire second relay plate 29 including the second joint part 26 may be covered by the nickel layer. These examples are described later.

In the semiconductor device 2, not only the upper surface 13a of the first joint part 13, but also the side surface 13b continuous from the upper surface 13a are covered by the nickel layer 19a. Hence, in a case where the solder material on the upper surface 13a overflows onto the side surface 13b, the layer of intermetallic compound Ni3Sn4 is formed on the nickel layer 19a on the side surface 13b. Both the upper surface 13a and the side surface 13b are covered by the nickel layer 19a and the layer of intermetallic compound Ni3Sn4. Therefore, movements of atoms are prevented not only in the bonded surface (the upper surface 13a) but also in the side surface 13b. If the side surface 13b is not covered by the nickel layer 19a, the layer of intermetallic compound Ni3Sn4 is formed on the bonding interface in the upper surface 13a, and the layer of a different intermetallic compound (a layer of Cu6Sn5 or Cu4Sn) is formed in the side surface 13b. In such a case, atoms may move between different intermetallic compounds, which could cause generation and growth of voids. On the contrary, in the semiconductor device 2, since the upper surface 13a, which is in contact with the bonding layer 8g, and the side surface 13b of the upper surface 13a are covered by the nickel layer 19a, the intermetallic compound Ni3Sn4 is formed on the upper surface 13a and the side surface 13b. Because the nickel layer 19a covers not only the surface bonded with the bonding layer 8g (the upper surface 13a) but also the side surface 13b continuous from the bonded surface, generation and growth of the voids in the bonding layer 8g are restrained.

In the second joint part 26 bonded to the first joint part 13, the nickel layer 19b covers the lower surface 26c facing the first joint part 13, and the side surface 26b continuous from the lower surface 26c. Similarly to the first joint part 13, generation and growth of voids are also restrained in the second joint part 26 on the bonding layer 8g. In this way, in the semiconductor device 2 according to the first embodiment, generation and growth of voids are restrained in the bonding layer 8g between the first joint part 13 and the second joint part 26 that face each other.

Other than the nickel layers 19a, 19b, the semiconductor device 2 also has mechanisms that restrain generation of voids in the bonding layer 8g that bonds the first joint part 13 and the second joint part 26 to each other. One of them is thicknesses of the bonding layers. Symbol Wg in FIG. 7 shows a thickness of the bonding layer 8g. Symbol Wa shows a thickness of the bonding layer 8a, symbol Wb shows a thickness of the bonding layer 8b, and symbol Wc shows a thickness of the bonding layer 8c. Further, symbol Wd shows a thickness of the bonding layer 8d, and symbol We shows a thickness of the bonding layer 8e, and symbol Wf shows a thickness of the bonding layer 8f. The thicknesses Wa to Wf are generally the same. On the other hand, the thickness Wg of the bonding layer 8g is smaller than the thickness Wa of the first bonding layer 8a and so on. The thinner the bonding layer is, the slower voids grow. This is because of the following reasons.

It is known that growth of voids is restrained more when a critical current density j of a current path is larger. The critical current density j is expressed by the numerical formula 1 below.

$$j = \frac{Y \cdot dE \cdot Om}{Z^* e \cdot p \cdot dx} \quad \text{(Numerical Formula 1)}$$

Meanings of the symbols in the numerical formula 1 are as follows.
j: a critical current density of a current path
Y: Young's modulus of a conductor in the current path
dE: an elastic limit value of the conductor in the current path
Om: an atomic volume of the conductor in the current path
$Z^*e$: an effective charge of the current path
p: resistivity of the current path
dx: a wiring length of the current path The critical current density j of each of the bonding layers 8a to 8g is considered. In this case, the wiring length dx of the current path in the numerical formula 1 corresponds to a thickness of each of the bonding layers 8a to 8g. The shorter the wiring length dx of the current path is, the larger the critical current density j becomes. In short, generation and growth of voids are restrained more when the thickness of the bonding layer becomes small.

In the case of the semiconductor device 2 of the first embodiment, the semiconductor elements such as the first transistor element 3 is not greatly affected even if the thickness Wg of the bonding layer 8g between the first joint part 13 and the second joint part 26 is reduced to be smaller than the thicknesses Wa to Wf of the rest of the bonding layers 8a to 8f. The reasons of this are explained below. Since the thicknesses Wa to Wf of the bonding layers 8a to 8f are almost the same, the thickness Wa of the bonding layer 8a is used in the following explanation as a reference. Although the semiconductor device 2 includes the plurality of semiconductor elements (the first transistor element 3, the second transistor element 5, the first diode element 4, and the second diode element 6), the first transistor element 3 is used as a reference in the following explanation.

In general, a thick bonding layer is preferred in order to reduce a load on the bonding layer caused by temperature changes (temperature stress). In the semiconductor device 2, the first transistor element 3 is a heat source. The semiconductor device 2 also includes other semiconductor elements that serve as heat sources. However, as stated earlier, the first transistor element 3 is herein focused on for convenience of explanation. Therefore, it is not possible to largely reduce the thickness Wa of the first bonding layer 8a near the heat source in the viewpoint of reducing a load. On the other hand, the first joint part 13 is away from the first transistor element 3 that is a heat source, and extends from an edge of the heat sink 12. A part of heat from the first transistor element 3 is dissipated through the heat sink 12. Hence, temperature stress applied on the bonding layer 8g, which bonds the first joint part 13 and the second joint part 26 to each other, is smaller than temperature stress applied to the bonding layer 8a. Therefore, the bonding layer 8g can be thinner than the bonding layer 8a. The size of the semiconductor element is decided depending on its rated current in consideration of a heat dissipation property. Specifically, the size of the semiconductor element is decided so that temperature of the element in use does not exceed junction temperature of the element.

All of the bonding layers 8a to 8f are positioned between the transistor elements, serving as heat sources, and the heat sinks, and thus have greater temperature stress compared to the bonding layer 8g. Therefore, it is possible to make the thickness of the bonding layer 8g smaller than that of any of the bonding layers 8a to 8f.

In one example, the thicknesses Wa to Wf of the bonding layers 8a to 8f are about 100 to 150 microns. The bonding layer 8g is able to endure temperature stress sufficiently even if its thickness Wg is 10 microns or smaller.

The semiconductor device 2 further includes another mechanism for restraining generation of voids in the bonding layer 8g. The mechanism is that the bonding layer 8g is structured only from an intermetallic compound layer, while each of the bonding layers 8a to 8f is structured from a layer maintaining a composition of the solder material, and the intermetallic compound layer. When a tin-based solder material is used, an intermetallic compound layer grows in an interface between a bonding layer and a conductor. In the case of a Su—Cu solder material, an intermetallic compound layer of $Cu_6Sn_5$, or $Cu_3Sn$ grows inside a bonding layer. In the case of a Su—Cu—Ni solder material, an intermetallic compound layer of $Cu_6Sn_5$, $Cu_3Sn$ or $Ni_3Sn_4$ grows. Young's moduli of these substances are greater than Young's modulus of tin (Sn), a main component of a tin-based solder material. In each of the bonding layers 8a to 8f, the above-mentioned intermetallic compound layer is formed in the interface of the bonding layer. At the same time, a layer maintaining a composition of the solder material remains between the intermetallic compound layers on both sides. On the other hand, in the bonding layer 8g, most of tin inside the solder material is changed into an intermetallic compound of tin, and a layer maintaining a composition of the solder material does not remain. Because there is not the layer maintaining the composition of the solder material, generation of voids in the bonding layer 8g is restrained. This mechanism is explained next.

Figure 8A:
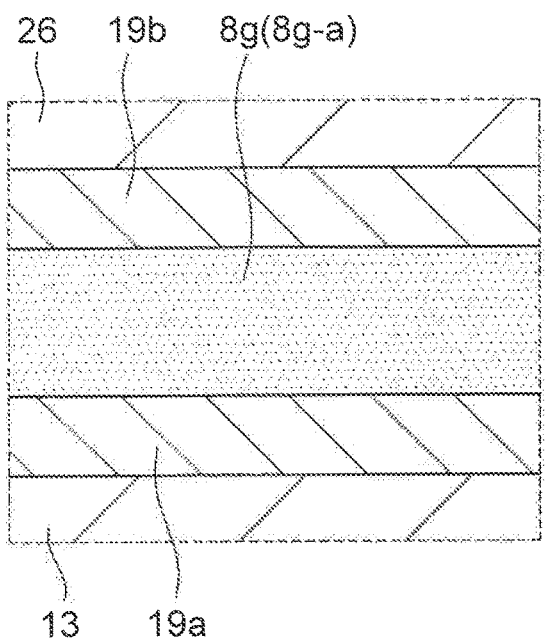
FIG. 8A is an enlarged sectional view of a bonding layer 8g.
Figure 8B:
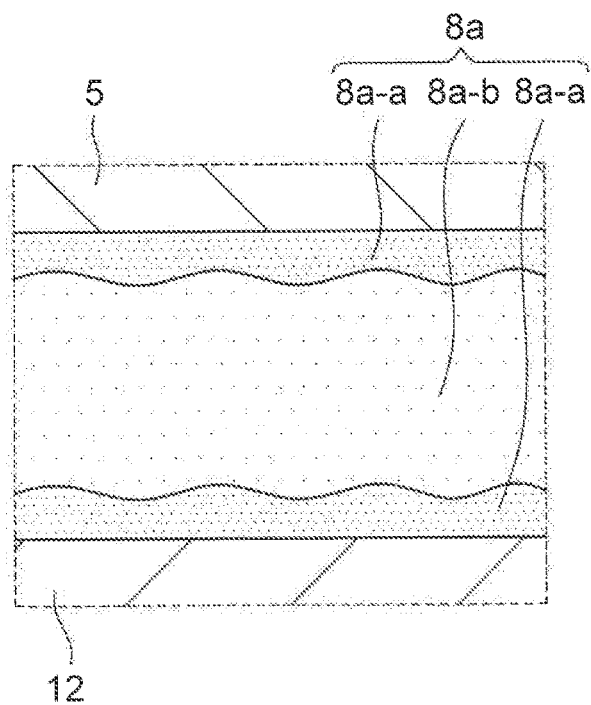
Figures 9, 10:
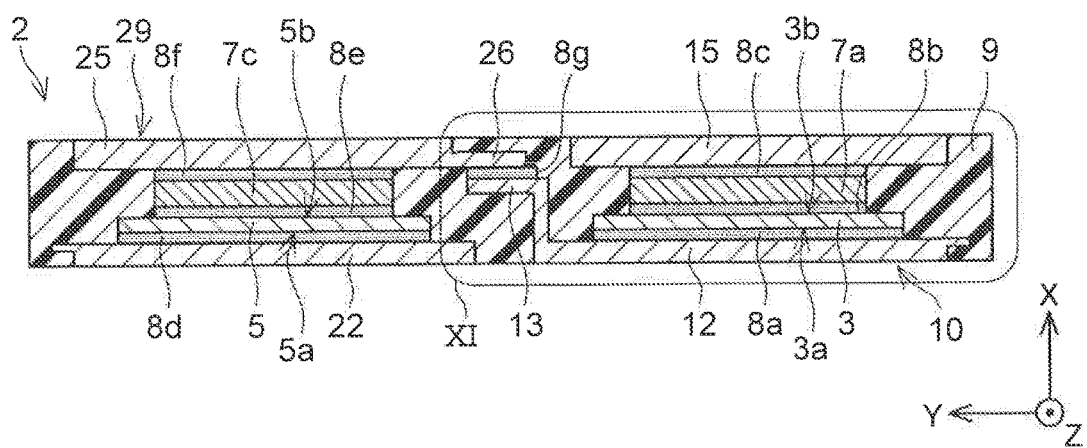
FIG. 9 shows a comparison of Young's modulus among some bonding materials.
FIG. 10 is a sectional view of a semiconductor device according to a modified example.

As a representative of the bonding layers 8a to 8f, the first bonding layer 8a is used again as a reference in the explanation. FIG. 8A shows an enlarged view of a range indicated by symbol VIIIA in FIG. 7, and FIG. 8B shows an enlarged view of a range indicated by symbol VIIIB in FIG. 7. Further, FIG. 9 shows a comparison of Young's moduli of the tin-based solder (a Sn-based solder) and several intermetallic compounds. Ag in FIG. 9 means silver. Silver will be mentioned later.

FIG. 8A is an enlarged sectional view of the bonding layer 8g between the first joint part 13 and the second joint part 26, and FIG. 8B is an enlarged sectional view of the bonding layer 8a between the heat sink 12 and the first transistor element 3. The surface of the first joint part 13 is covered by the nickel layer 19a, and the surface of the second joint part 26 is covered by the nickel layer 19b.

Closely-spaced dot hatching in FIG. 8A and FIG. 8B shows the intermetallic compound layers, and widely-spaced dot hatching shows the layer maintaining the composition of the solder material. The bonding layer 8g is structured entirely from an intermetallic compound layer 8g-a. On the other hand, the bonding layer 8a is structured from intermetallic compound layers 8a-a formed in the interfaces of the bonding layer, and a layer 8a-b remaining between the two intermetallic compound layers 8a-a. The intermetallic compound layers 8g-a are intermetallic compound layers generated due to reaction between the tin-based solder material and nickel in the nickel layers 19a, 19b, and, specifically, are made of $Ni_3Sn_4$. Meanwhile, the intermetallic compound layer 8a-a in the bonding layer 8a is a compound layer generated due to reaction between copper in the heat sink 12 and copper in the collector electrode of the first transistor element 3, and the tin-based solder material, and is made of $Cu_6Sn_5$ or $Cu_3Sn$. The layer 8a-b sandwiched between the intermetallic compound layers 8a-a is a layer in which tin in the tin-based solder material is not changed into the intermetallic compound, and the composition of the solder material is maintained. In short, the main component of the layer 8a-b is tin (Sn).

As shown in FIG. 9, Young's moduli of the intermetallic compounds $Ni_3Sn_4$, $Cu_6Sn_5$, and $Cu_3Sn$ are greater than Young's modulus of the tin-based solder. As evident from the foregoing numerical formula 1, the higher Young's modulus is, the larger the critical current density j becomes. The larger the critical current density j is, the more generation and growth of voids are restrained. The bonding layer 8a, which is bonded to the surface of the electrode of the first transistor element 3, includes at least the layer containing tin with the first Young's modulus (the layer maintaining the composition of the solder material), and, the bonding layer 8g between the first joint part 13 and the second joint part 26 is formed from an intermetallic compound having Young's modulus higher than the first Young's modulus. The likelihood of generation of voids due to the EM phenomenon depends on the lowest Young's modulus. In the bonding layer 8g having no tin-based layer, generation and growth of voids are restrained.

Similar effect is also obtained by forming the bonding layer 8g from a silver sintered material instead of the solder material. This is because, as shown in FIG. 9, Young's modulus of silver (Ag) is higher than Young's modulus of the tin-based solder material.

In the bonding layer 8a, which is in contact with the first transistor element 3, an increase in size of the intermetallic compound layer 8a-a with high Young's modulus is not preferred. This is because of the following reasons. In the first transistor element 3, the resin of the package 9 is filled in the periphery of the exposed electrode. Resin and metal has different linear expansion coefficients. Stress is generated in the boundary between the rein and the bonding layer because of the difference in linear thermal expansion coefficient. When the intermetallic compound layer in the interface between the bonding layer 8a and the first transistor element 3 is thick, rigidity of the bonding layer 8a becomes high. Then, stress generated in the resin-made package 9 in the first transistor element 3 becomes high, and the high stress could damage a housing of the first transistor element 3. Thus, in the bonding layer 8a, which is in contact with the first transistor element 3, an increase in the thickness of the intermetallic compound layer with high Young's modulus is not preferred. Meanwhile, the bonding layer 8g bonds the first joint part 13 to the second joint part 26, which are both made from metal. Rigidity of the bonding layer 8g is not as strictly restricted as that of the bonding layer 8a that bonds the first transistor element 3. This means that it is possible to structure the bonding layer 8g, which bonds the metallic joint parts to each other, from a substance with higher Young's modulus (for example, an intermetallic compound layer and a layer made of a silver sintered material), compared to the bonding layer 8a that bonds the semiconductor element (the first transistor element 3) and the conductive member (the heat sink 12) to each other.

The intermetallic compounds $Cu_6Sn_5$, $Cu_3Sn$, $Ni_3Sn_4$ grow while the tin-based solder material is being heated. Therefore, the semiconductor device 2 having the aforementioned structure is easily manufactured by using the same tin-based solder material for all bonding layers, stopping heating while the layers maintaining the composition of the tin-based solder still remain in the bonding layers 8a to 8f, and continuing heating until the entire bonding layer 8g becomes the intermetallic compound layer. This manufacturing method is described later.

Figure 11:
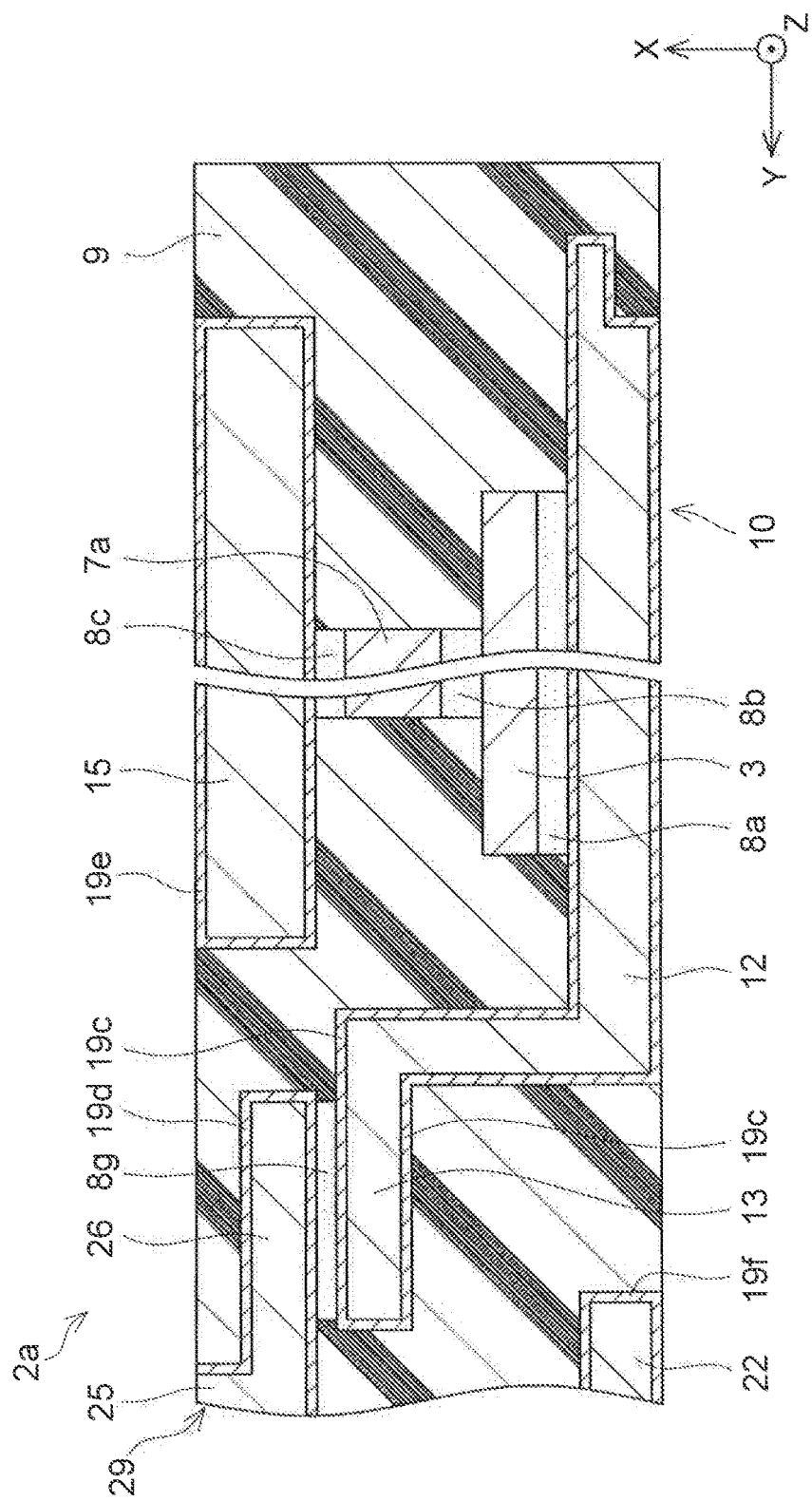
FIG. 11 is an enlarged view of a range shown by sign XI in FIG. 10.

A modified example of the semiconductor device 2 is explained using FIG. 10 and FIG. 11. In a semiconductor device 2a in the modified example, lead frames are entirely covered by a nickel layer. The sectional view in FIG. 10 is a sectional view in which a nickel layer is not shown, and is the same as FIG. 5. FIG. 11 is an enlarged view of a range indicated by symbol XI in FIG. 10. Although partially not shown in FIG. 11, an intermediate terminal 10 (a heat sink 12 and a first joint part 13) is entirely covered by a nickel layer 19c, and a second relay plate 29 (a heat sink 25 and a second joint part 26) is entirely covered by a nickel layer 19d. A heat sink 15 is entirely covered by a nickel layer 19e, and a heat sink 22 is entirely covered by a nickel layer 19f. The nickel layers 19c, 19d, 19e, 19f are generated simultaneously by a one-time plating. In the semiconductor device 2a, surfaces of the conductive members are covered by the nickel layers not only in a bonding layer 8g having a small bonding area, but also in the other bonding layers 8a to 8f. Thus, generation and growth of voids are restrained.

Figure 12:
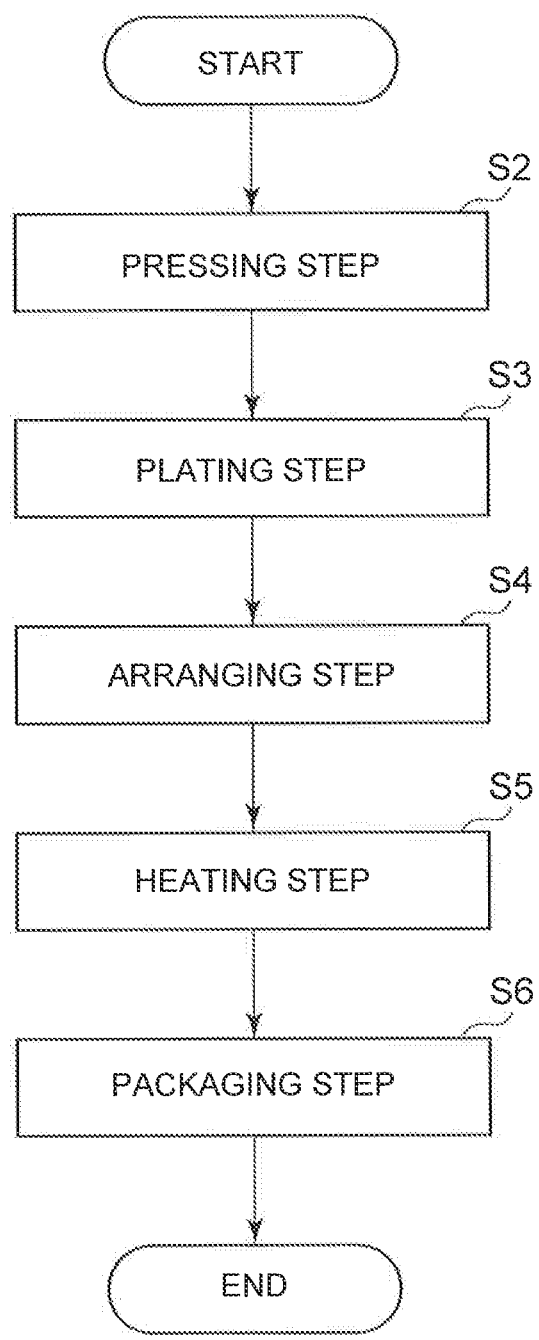
FIG. 12 is a flowchart of a manufacturing method for the semiconductor device.

Next, a manufacturing method for the semiconductor device 2 is explained with reference to FIG. 12 to FIG. 17. FIG. 12 shows a flowchart diagram of the manufacturing method for the semiconductor device 2. This manufacturing method includes a pressing step (S2), a plating step (S3), an arranging step (S4), a heating step (S5), and a packaging step (S6).

Figure 13:
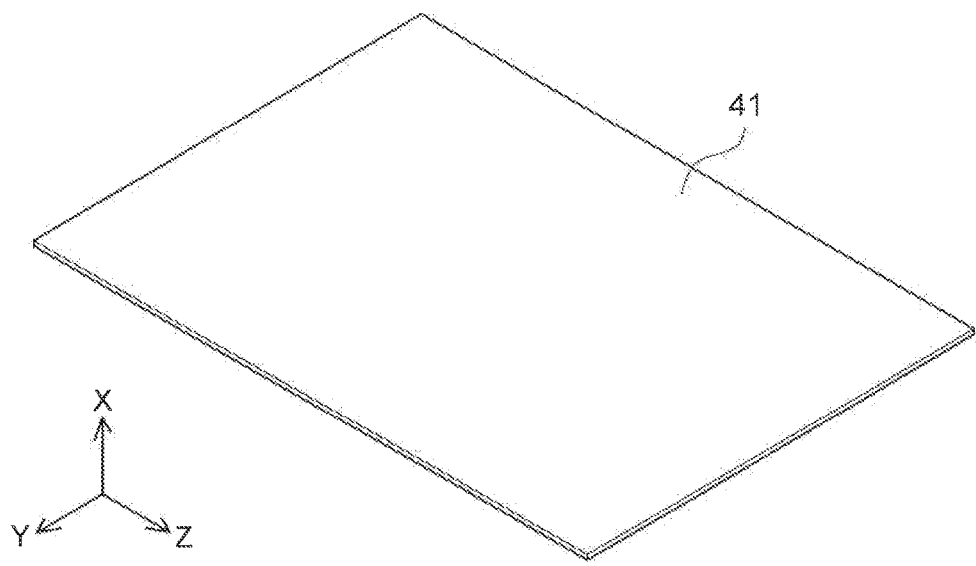
FIG. 13 is the first view for explaining the manufacturing method for the semiconductor device.
Figure 14:
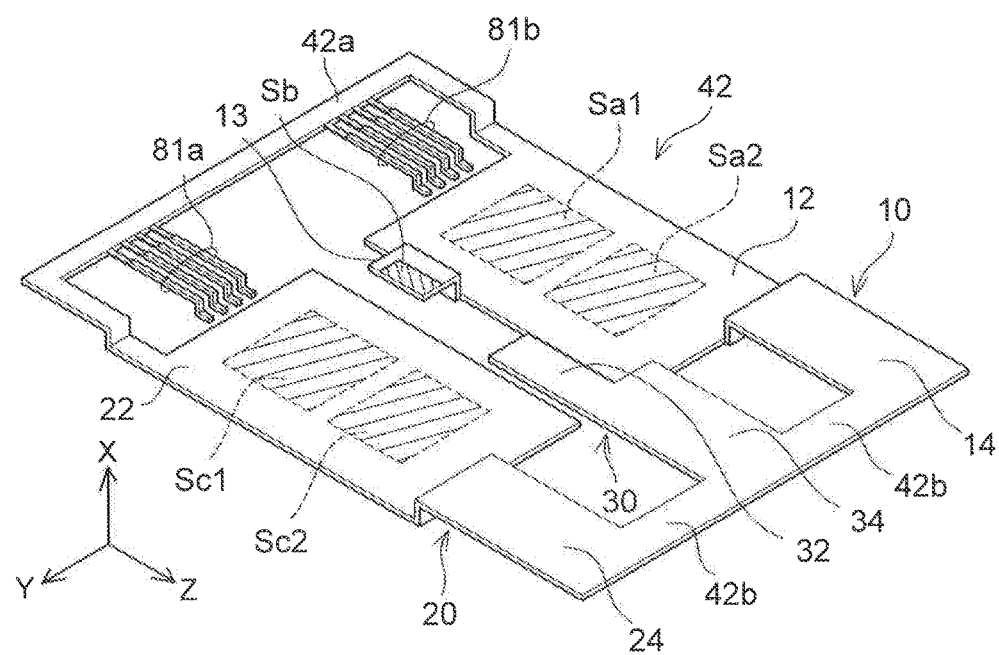
FIG. 14 is the second view for explaining the manufacturing method for the semiconductor device.

In the pressing step (S2), one copper plate (hoop material) is pressed to make a lead frame part. FIG. 13 shows one copper plate 41. The copper plate 41 shown in FIG. 13 is processed by a press, and a lead frame part 42 shown in FIG. 14 is manufactured. The lead frame part 42 is a part in which the lead frames (the intermediate terminal 10, the positive electrode terminal 20, the negative electrode terminal 30, the control terminals 81a, and the control terminals 81b) included in the semiconductor device 2 are connected to each other by runner parts 42a, 42b. Other than the lead frame part 42, the first relay plate 28 and the second relay plate 29 are made from the same hoop material in this pressing step.

The plating step (S3) is carried out after the pressing step. In this step, nickel is plated on the entire surfaces of the lead frame part 42, the first relay plate 28, and the second relay plate 29. The nickel plating may be carried out in an electroplating method or an electroless nickel plating method. The electroless nickel plating method is a plating method in which the lead frame part 42 and so on are immersed in plating liquid containing nickel. Due to electrons emitted by oxidization of a reducing agent contained in the plating liquid, a nickel film is deposited on the surfaces of the lead frame part 42 and so on. An advantage of this method is that a nickel film having a uniform thickness is formed regardless of the shapes of the lead frame part and so on.

Symbol Sb in FIG. 14 shows a region where the second joint part 26 of the second relay plate 29 (not shown in FIG. 14) is going to be bonded (a region to be bonded). Symbols Sa1, Sa2 show regions where the first transistor element 3 and the first diode element 4 are going to be bonded, respectively (regions to be bonded). Symbols Sc1, Sc2 show regions where the second transistor element 5 and the second diode element 6 are going to be bonded, respectively (regions to be bonded). Because nickel is plated after pressing, the nickel layer is formed not only on the surfaces including the regions to be bonded (bonded surfaces) but also on side surfaces continuous from the bonded surfaces. Because the side surfaces continuous from the bonded surfaces are plated, generation and growth of voids are restrained.

Figure 15:
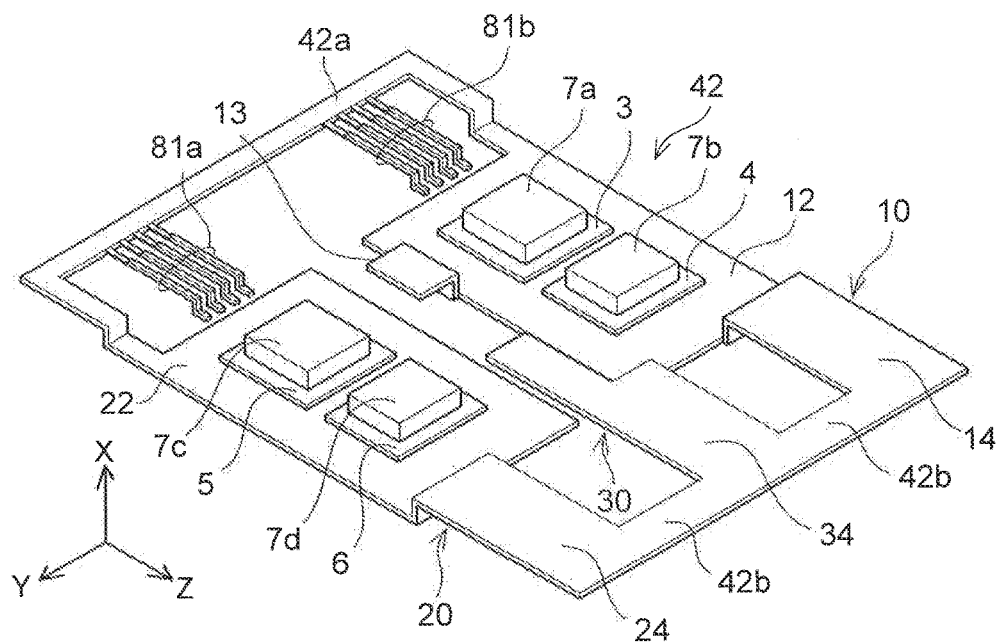
FIG. 15 is the third view for explaining the manufacturing method for the semiconductor device.

The arranging step (S4) is explained with reference to FIG. 15 and FIG. 16. In this step, the first transistor element 3 is stacked to the heat sink 12 through the solder material, and the spacer 7a is stacked to the first transistor element 3 through the solder material. The first transistor element 3 is stacked in the region to be bonded Sa1 shown in FIG. 14. Further, the first diode element 4 is stacked to the heat sink 12 through the solder material, and the spacer 7b is stacked to the first diode element 4 through the solder material. The first diode element 4 is stacked in the region to be bonded Sa2 shown in FIG. 14. Meanwhile, the second transistor element 5 is stacked to the heat sink 22 through the solder material, and the spacer 7c is stacked to the second transistor element 5 through the solder material. The second transistor element 5 is stacked in the region to be bonded Sc1 shown in FIG. 14. Further, the second diode element 6 is stacked to the heat sink 22 through the solder material, and the spacer 7d is stacked to the second diode element 6 through the solder material. The second diode element 6 is stacked in the region to be bonded Sc2 shown in FIG. 14. Next, the first relay plate 28 is stacked to the spacers 7a and 7b through the solder material. The second relay plate 29 is stacked to the spacers 7c and 7d through the solder material. The second relay plate 29 is stacked so that the second joint part 26 overlaps the region to be bonded Sb shown in FIG. 14. The solder material is also sandwiched between the first joint part 13 and the second joint part 26.

The solder material, which is thinner than the other solder materials, is sandwiched between the first joint part 13 and the second joint part 26. Because the solder material having the smaller thickness than the others is sandwiched only between the first joint part 13 and the second joint part 26, it is possible to make the bonding layer 8g thinner than the rest of the bonding layers 8a to 8f as stated earlier, thereby restraining generation and growth of voids in the bonding layer 8g.

The region to be bonded Sb is smaller than the other regions to be bonded Sa1 and so on. Hence, the amount of solder material sandwiched between the first joint part 13 and the second joint part 26 is less than the amount of solder material sandwiched between the heat sink 12 and the first transistor element 3. The amount of the solder material sandwiched between the first joint part 13 and the second joint part 26 is less than the amounts of solder materials sandwiched in the other locations. To be in more detail, the amount of the solder material is adjusted so that the amount of a tin-based solder material sandwiched between the first joint part 13 and the second joint part 26 becomes less than both the amount of the tin-based solder material sandwiched between the first transistor element 3 and the heat sink 12 and the amount of the tin-based solder material sandwiched between the second transistor element 5 and the heat sink 25. This produces an effect in the next heating step.

Figure 16:
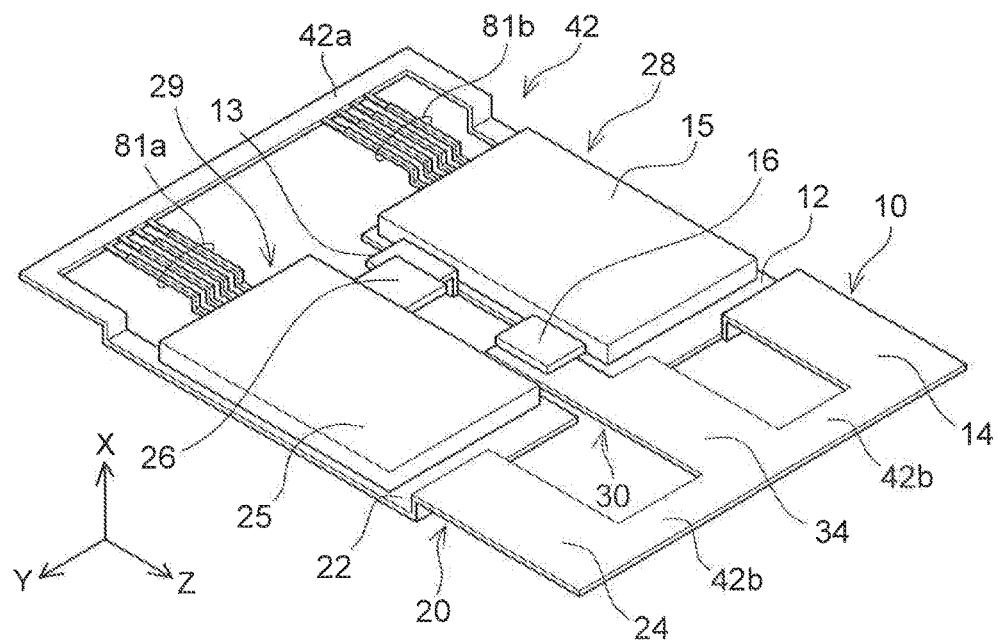
FIG. 16 is the fourth view for explaining the manufacturing method for the semiconductor device.

In the heating step (S5), an assembly of the elements, the lead frame part 42, and the heat sinks 15, 25 shown in FIG. 16 is put in a high-temperature furnace, and heated at specified temperature for a specified period. The heating temperature and the heating period are determined so that a layer maintaining a composition of the tin-based solder material remains in the bonding layers 8a to 8f, and that a layer maintaining the composition of the tin-based solder material disappears in the bonding layer 8g. In short, heating is stopped in a state where a layer maintaining a composition of the tin-based solder material remains in the bonding layers 8a to 8f, and the layer maintaining the composition of the tin-based solder material disappears in the bonding layer 8g. In the bonding layer 8g, most of tin (Sn) contained in the tin-based solder material is changed into an intermetallic compound. As explained in the arranging step, the amount of the solder material sandwiched between the first joint part 13 and the second joint part 26 is less than the amount of the solder material sandwiched in the other locations. Therefore, as stated above, as a result of a one-time heating, the composition of the tin-based solder material does not remain only in the bonding layer 8g, and the layer maintaining the composition of the tin-based solder material remains in the rest of the bonding layers. By changing most tin inside the solder material into the intermetallic compound only in the bonding layer 8g, generation and growth of voids are restrained in the bonding layer 8g.

Figure 17:
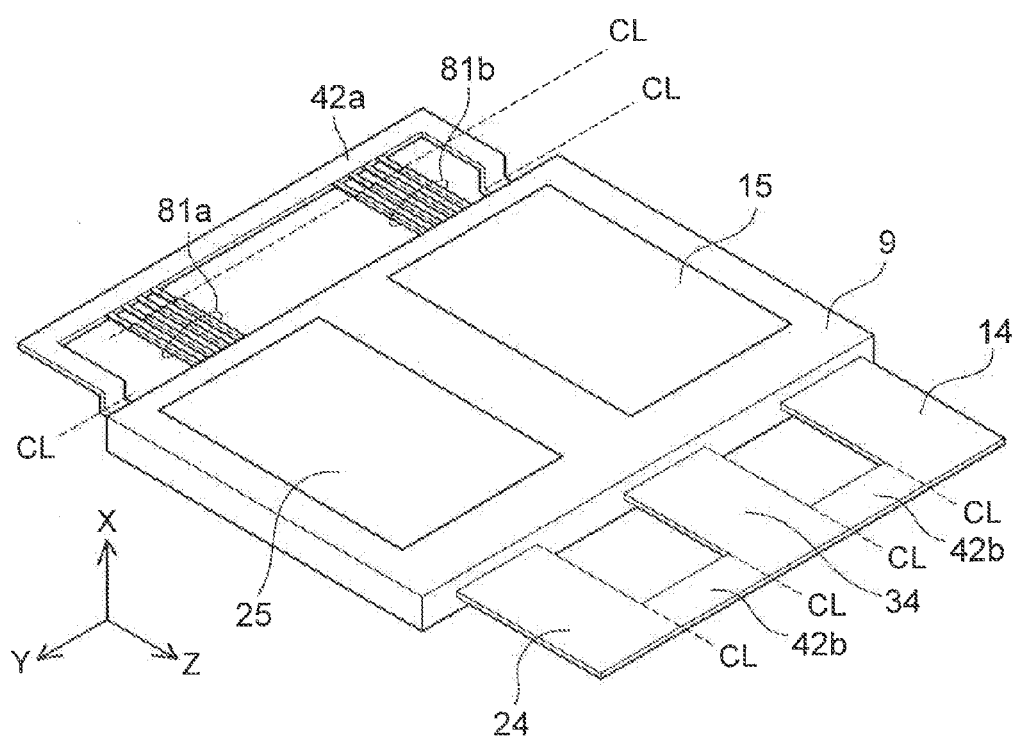
FIG. 17 is the fifth view for explaining the manufacturing method for the semiconductor device.

In the packaging step (S6), after a primary is applied to the assembly, in which the transistor elements, the heat sinks, and so on are joined together in the heating step, the assembly is put in an injection mold and the resin-made package 9 is formed. The device after the package 9 is formed is shown in FIG. 17. Finally, the runner parts 42a, 42b of the lead frame part 42 are cut off at the locations of the broken lines CL in FIG. 17, thereby completing the semiconductor device 2 shown in FIG. 1.

The lead frame part is a part in which some lead frames (the intermediate terminal 10, the positive electrode terminal 20, the negative electrode terminal 30, and the control terminals 81a, 81b) are connected to each other, and is formed by pressing. In the related art, when plating lead frames, the plating is carried out at a stage of a hoop material (one plate material) before pressing from the viewpoint of processing cost. The plated hoop material is formed into the lead frame part 42 by pressing. Then, a nickel layer is formed on flat surfaces of each lead frame including the joint parts 13, 26 (flat surfaces of plate materials including the upper surface 13a of the joint part 13 and the lower surface 26c of the joint part 26 after pressing). However, the nickel layer is not formed on side surfaces of the joint parts (side surfaces of the plate materials), which are continuous from the bonded surfaces. This applies to the first relay plate 28 and the second relay plate 29. Unlike the related art, in the above-mentioned manufacturing method, plating is done after the lead frame part 42 and so on are formed by pressing. Therefore, it is possible to obtain lead frames having plated layers even on the side surfaces of the joint parts (side surfaces of the plate materials), which are continuous from the bonded surfaces. When the first joint part 13 and the second joint part 26 are small, and the area of the bonding layer 8g is reduced accordingly, the EM phenomenon is likely to happen through the side surfaces of the joint parts. For example, a bonding material that leaks from the bonded surface is adhered to the side surface of the joint part, and that is where the EM phenomenon could happen. The technology according to the first embodiment is able to effectively restrain the EM phenomenon at the joint parts by providing the nickel layer even on the side surfaces of the joint parts where the nickel layers have not been necessary.

With a manufacturing method, in which the plating step (S3) is removed from the manufacturing method shown in FIG. 12, it is also possible to manufacture a semiconductor device in which generation and growth of voids are restrained. A semiconductor device, which is manufactured in a manufacturing method without the plating step (S3), has no nickel layer. In the manufacturing method without the plating step, a semiconductor device is manufactured, in which a bonding layer 8g between a first joint part 13 and a second joint part 26 is structured only from an intermetallic compound of tin and is thinner than the other bonding layers 8a to 8f. In the other bonding layers 8a to 8f in the semiconductor device, layers each maintaining a composition of a tin-based solder material remain. The semiconductor device manufactured as stated above is not able to obtain an inhibitory effect of voids by a nickel layer, but is expected to have an inhibitory effect of voids because of the bonding layer 8g being thinner than the other bonding layers including the bonding layer 8a. Also, the semiconductor device is expected to have an inhibitory effect of voids because Young's modulus of a substance structuring the bonding layer 8g is higher than the lowest Young's modulus among Young's moduli of substances contained in the bonding layer 8a.

Figure 18:
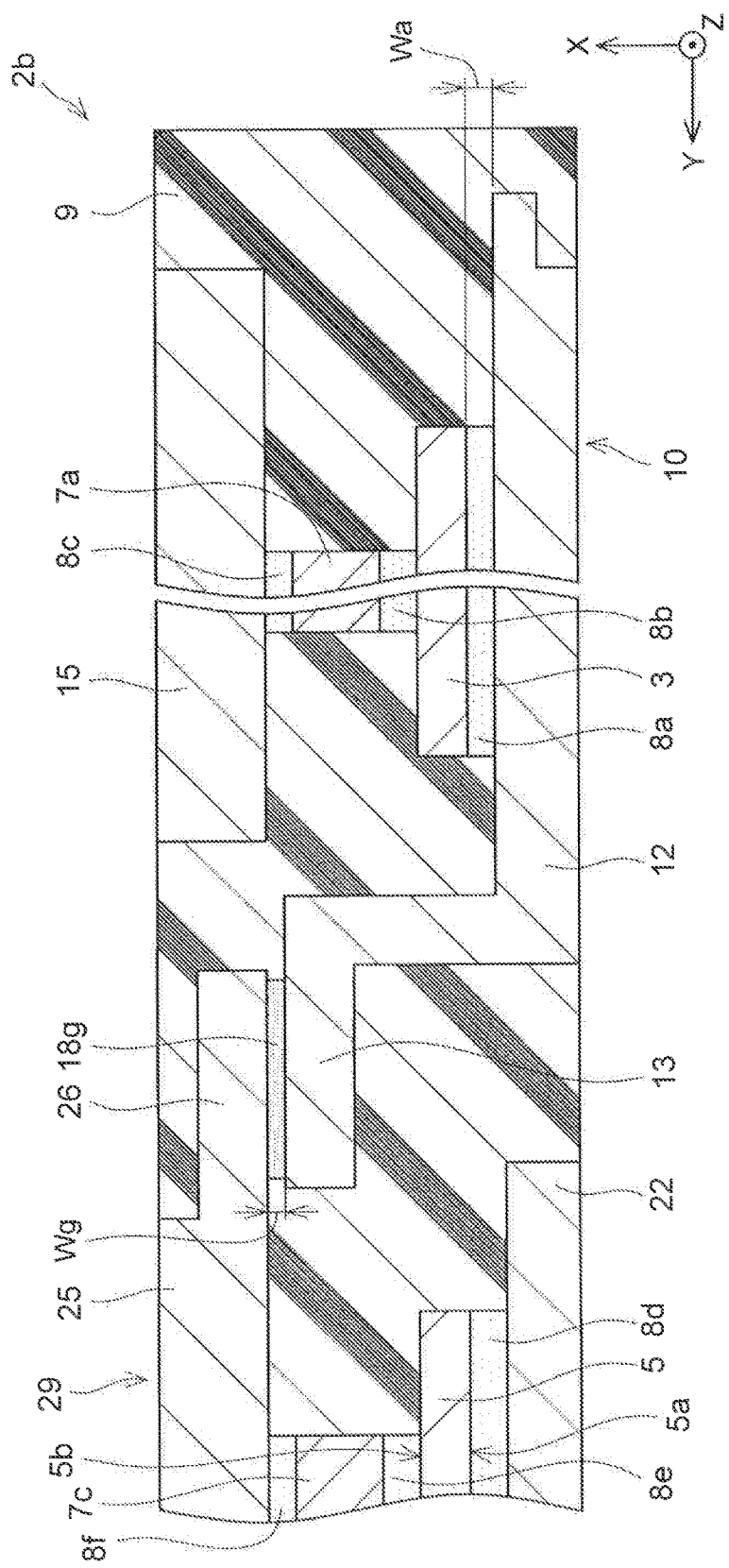
FIG. 18 is a partial sectional view of a semiconductor device according to the second embodiment of the invention.

Next, a semiconductor device according to the second embodiment and a manufacturing method for the semiconductor device are explained with reference to FIG. 18 and FIG. 19. FIG. 18 is a partial sectional view of a semiconductor device 2b according to the second embodiment. The semiconductor device 2b of the second embodiment is different from the semiconductor device 2 of the first embodiment in that there is no nickel layer. A bonding layer 18g between a first joint part 13 and a second joint part 26 is sinter-bonded by a silver sintered material (Ag sintered material). Therefore, the bonding layer 18g contains at least one of silver and an intermetallic compound of silver. The rest of bonding layers 8a to 8f are layers made from a tin-based solder material similarly to the first embodiment, and include layers maintaining a composition of the tin-based solder material. Young's modulus of silver (Ag) is higher than that of tin. Therefore, in the bonding layer 18g between the first joint part 13 and the second joint part 26, an inhibitory effect of voids is expected. Also, a thickness Wg of the bonding layer 18g is smaller than a thickness Wa of the bonding layer 8a. Thicknesses of the rest of the bonding layers 8b to 8f are generally the same as the thickness Wa of the bonding layer 8a. This also contributes to restraint of voids in the bonding layer 18g.

Figure 19:
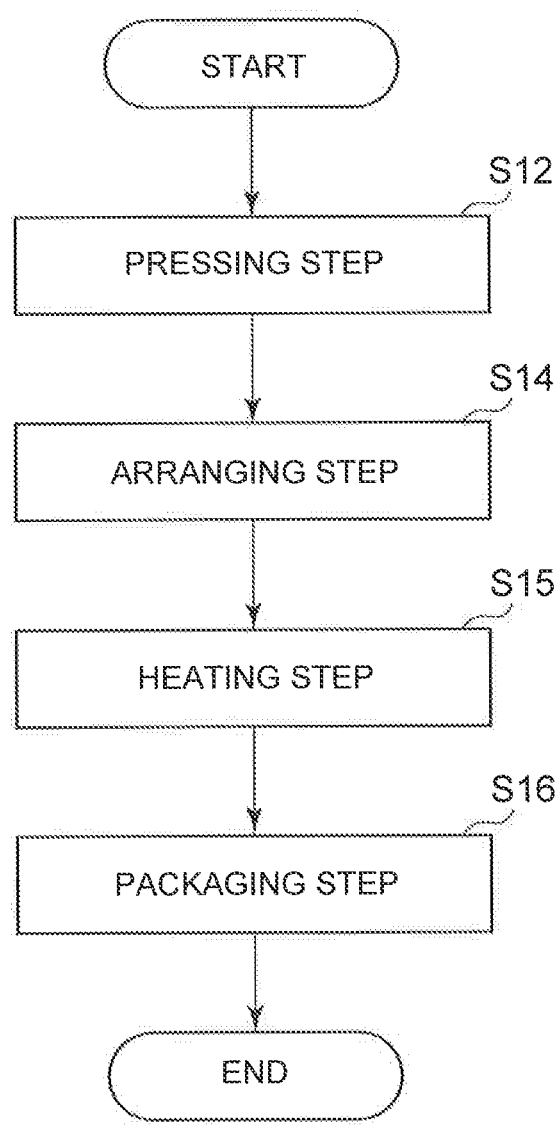
FIG. 19 is a flowchart diagram of another manufacturing method for a semiconductor device.

FIG. 19 shows a flowchart of a manufacturing method for the semiconductor device 2b. A pressing step (S12) is the same as the pressing step S2 in the flowchart shown in FIG. 14. In an arranging step (S14), a first transistor element 3 and so on are stacked to a lead frame part 42. At that time, a silver paste (a silver sintered material) is applied between the first joint part 13 and the second joint part 26. A tin-based solder material is arranged in gaps that correspond to the bonding layers 8a to 8f. The silver paste (the silver sintered material) is applied to be thinner than the thickness of the tin-based solder material. In the heating step (S15), an assembly, in which the silver paste (the silver sintered material) is applied and the tin-based solder material is sandwiched in the arranging step, is heated. Locations corresponding to the bonding layers 8a to 8f are heated at specified heating temperature for a specified heating period, which are set in the heating step (S5) in the flowchart in FIG. 12. Here, heating temperature and period are adjusted so that layers maintaining a composition of the tin-based solder material remain in the bonding layers 8a to 8f. In this heating step, a space between the first joint part 13 and the second joint part 26 is heated locally. In this heating, for example, the silver paste (the silver sintered material) is baked and cured at 200° C. for an hour. In short, the silver paste is heated and solidified, thereby bonding the first joint part 13 and the second joint part 26 to each other. After sinter-bonding, the silver paste is changed into a metal silver with high melting point. A melting point of the metal silver with high melting point is 900° C. or higher. In this way, the first joint part 13 and the second joint part 26 are bonded to each other by the bonding layer 18g having high Young's modulus and a small thickness. The bonding layer 18g is made of silver having large Young's modulus, and the thickness Wg is smaller than those of the rest of the bonding layers 8a to 8f. As explained earlier with reference to the numerical formula 1, the higher the Young's modulus becomes, or the smaller the thickness becomes, the higher limiting current density becomes. Thus, generation of voids becomes unlikely. The thickness of the bonding layer corresponds to the wiring length dx of a current path in the numerical formula 1.

Next, in a packaging step (S16), after a primary is applied on the assembly after the bonding, the assembly is put in an injection mold, and a molten resin is injected. Thus, a package 9 is formed. Finally, runner parts of a lead frame part are cut off, thereby completing the semiconductor device 2b.

Several other characteristics of the semiconductor devices explained in the embodiments are listed. The semiconductor device 2 is a device in which the semiconductor elements (the first transistor element 3, the second transistor element 5, and so on) are molded in the resin-made package 9. The semiconductor elements are so-called power semiconductor elements having an allowable current of 100 A or higher. The semiconductor device 2 has the heat sinks on both sides of the package 9. The heat sinks 15, 25 are exposed on one of the surfaces of the package 9. The heat sinks 12, 22 are exposed on the other surface of the package 9. The heat sink 12 stacked to the first transistor element 3 is exposed on one surface of the package 9, and the heat sink 25 stacked to the second transistor element 5 is exposed on the other surface of the package 9. The first joint part 13 extending from the heat sink 12 and the second joint part 26 extending from the heat sink 25 are joined to each other inside the package 9. All of the bonding layers 8a to 8f are positioned in the middle of the heat transfer paths from the semiconductor elements such as the first transistor element 3 to the heat sinks, and only the bonding layer 8g is positioned in a heat transfer path in which the heat sinks are sandwiched between the semiconductor elements.

Notes regarding the technology explained in the embodiments are stated below. As explained earlier, the nickel layer 19a only needs to be formed on the bonded surface (the upper surface 13a) of the first joint part 13, and on the side surface 13b continuous from the bonded surface. Like the semiconductor device 2a according to the modified example, the nickel layer may be formed entirely on the intermediate terminal 10 and the other lead frames.

A substance, which can structure the bonding layer and has higher Young's modulus than tin, includes Ag3Sn in addition to those listed in FIG. 9.

The first transistor element 3 may be regarded as an example of the first semiconductor element. The second transistor element 5 may be regarded as an example of the second semiconductor element. The collector electrode 3a of the first transistor element 3 may be regarded as an example of the first electrode. The emitter electrode 5b of the second transistor element 5 may be regarded as an example of the second electrode. The intermediate terminal 10 may be regarded as an example of the first conductive member. The heat sink 12 of the intermediate terminal 10 may be regarded as an example of the first stack part. Another conductive member (for example, a spacer) may be sandwiched between the heat sink 12 and the first transistor 3. In this case, the heat sink 12 and the first transistor element 3 may be bonded to each other through a plurality of bonding layers.

The relay plate 29 may be regarded as an example of the second conductive member. The heat sink 25 may be regarded as an example of the second stack part. Another conductive member (for example, a spacer) may or may not be sandwiched between the second transistor element 5 and the heat sink 25. The second transistor element 5 and the heat sink 25 may be bonded to each other through the plurality of bonding layers (the bonding layers 8e, 8f) as shown in the embodiments, or may be bonded to each other directly by one bonding layer. The bonding layers 8g, 18g may be regarded as examples of an intermediate bonding layer. The bonding layer 8a may be regarded as an example of the first bonding layer. The bonding layers 8e, 8f may be regarded as examples of the second bonding layer.

Specific examples of the invention have been explained in detail, but are examples only, and do not limit the scope of the claims. The invention includes various modifications and changes of the specific examples described above. The technical elements explained in this specification and the drawings achieve technical utility alone or as various combinations, and are not limited to the combinations of the embodiments of the invention.

What is claimed is:

1. A semiconductor device comprising:
   a first semiconductor element; and
   a second semiconductor element electrically connected to the first semiconductor element by a first conductive member and a second conductive member, wherein
   a first electrode is arranged on a surface of the first semiconductor element,
   a second electrode is arranged on a surface of the second semiconductor element,
   the first conductive member has a first stack part stacked to the first semiconductor element to face the first electrode, and a first joint part extending from the first stack part,
   the second conductive member has a second stack part stacked to the second semiconductor element to face the second electrode, and a second joint part, the second joint part extending from the second stack part and facing the first joint part,
   the first electrode and the first stack part are bonded to each other by a first bonding layer,
   the second electrode and the second stack part are bonded to each other by a second bonding layer,
   the first joint part and the second joint part are bonded to each other by an intermediate bonding layer,
   an area of the intermediate bonding layer is smaller than both an area of the first bonding layer and an area of the second bonding layer when seen in a direction perpendicular to a bonded surface of the intermediate bonding layer,
   a first surface of the first joint part facing the second joint part, a side surface of the first joint part continuous from the first surface, a second surface of the second joint part facing the first joint part, and a side surface of the second joint part continuous from the second surface are covered by nickel layers, the side surface of the first joint part being vertical to the second surface and the side surface of the second joint part being vertical to the first surface, and
   the intermediate bonding layer covers the first surface and the side surface of the first joint part, and the second surface and the side surface of the second joint part.

2. The semiconductor device according to claim 1, wherein a thickness of the intermediate bonding layer is smaller than both a thickness of the first bonding layer and a thickness of the second bonding layer.

3. The semiconductor device according to claim 2, wherein

Young's modulus of the intermediate bonding layer is greater than both Young's modulus of the first bonding layer and Young's modulus of the second bonding layer.

4. The semiconductor device according to claim 3, wherein each of the first bonding layer and the second bonding layer includes a layer maintaining a composition of a tin solder material, and the intermediate bonding layer is made of an intermetallic compound of tin.

5. The semiconductor device according to claim 3, wherein each of the first bonding layer and the second bonding layer includes a layer maintaining a composition of a tin solder material, and the intermediate bonding layer is made of at least one of silver and a compound of silver.

6. A manufacturing method for the semiconductor device according to claim 1, comprising:

forming the first conductive member and the second conductive member by pressing a plate-shaped member; and forming a nickel layer on the first surface, the side surface continuous from the first surface, the second surface, and the side surface continuous from the second surface after the pressing.

7. A semiconductor device comprising:

a first semiconductor element; and a second semiconductor element electrically connected to the first semiconductor element by a first conductive member and a second conductive member, wherein a first electrode is formed on a surface of the first semiconductor element, a second electrode is formed on a surface of the second semiconductor element, the first conductive member has a first stack part stacked to the first semiconductor element to face the first electrode, and a first joint part extending from the first stack part, the second conductive member has a second stack part stacked to the second semiconductor element to face the second electrode, and a second joint part, the second joint part extending from the second stack part and facing the first joint part, the first electrode and the first stack part are bonded to each other by a first bonding layer, the second electrode and the second stack part are bonded to each other by a second bonding layer, the first joint part and the second joint part are bonded to each other by an intermediate bonding layer, an area of the intermediate bonding layer is smaller than both an area of the first bonding layer and an area of the second bonding layer when seen in a direction perpendicular to a bonded surface of the intermediate bonding layer, and Young's modulus of portions of the intermediate bonding layer directly bonded to the first and second joint parts is greater than both Young's modulus of the first bonding layer, and Young's modulus of the second bonding layer.

8. A manufacturing method for the semiconductor device according to claim 7, comprising:

arranging the first semiconductor element, the second semiconductor element, the first conductive member, and the second conductive member so as to have a positional relationship where the first semiconductor element and the first stack part are stacked to each other through a first tin solder material, the second semiconductor element and the second stack part are stacked to each other through a second tin solder material, and the first joint part and the second joint part face each other through a third tin solder material; and melting the first tin solder material, the second tin solder material, and the third tin solder material by heating the first tin solder material, the second tin solder material, and the third tin solder material in the positional relationship, wherein an amount of the third tin solder material is smaller than both an amount of the first tin solder material and an amount of the second tin solder material, and the heating is stopped in a state where a layer maintaining a composition of the third tin solder material disappears between the first joint part and the second joint part, a layer maintaining a composition of the first tin solder material remains between the first semiconductor element and the first stack part, and a layer maintaining a composition of the second tin solder material remains between the second semiconductor element and the second stack part.

* * * * *